(12) United States Patent
Robl et al.

(10) Patent No.: US 11,171,049 B2
(45) Date of Patent: Nov. 9, 2021

(54) SEMICONDUCTOR DEVICE AND A METHOD OF FORMING THE SEMICONDUCTOR DEVICE

(71) Applicant: Infineon Technologies Austria AG, Villach (AT)

(72) Inventors: Werner Robl, Regensburg (DE); Michael Fugger, Vienna (AT); Carsten Schaeffer, Annenheim (AT); Michael Nelhiebel, Villach (AT); Klemens Pruegl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 44 days.

(21) Appl. No.: 16/404,745

(22) Filed: May 7, 2019

(65) Prior Publication Data
US 2019/0267283 A1    Aug. 29, 2019

Related U.S. Application Data

(62) Division of application No. 14/953,502, filed on Nov. 30, 2015, now Pat. No. 10,332,793.

(51) Int. Cl.
*H01L 21/768* (2006.01)
*H01L 21/285* (2006.01)
*H01L 23/532* (2006.01)

(52) U.S. Cl.
CPC .. *H01L 21/76868* (2013.01); *H01L 21/28518* (2013.01); *H01L 21/76843* (2013.01); *H01L 21/76864* (2013.01); *H01L 21/76867* (2013.01); *H01L 21/76886* (2013.01);
(Continued)

(58) Field of Classification Search
CPC ......... H01L 23/53233; H01L 21/76868; H01L 21/28518; H01L 21/76843; H01L 21/76864; H01L 21/76867; H01L 21/76886; H01L 21/768; H01L 21/285;
(Continued)

(56) References Cited

U.S. PATENT DOCUMENTS

2007/0218690 A1*  9/2007  Onishi ............. H01L 21/76843
                                                   438/687
2010/0096172 A1   4/2010  Tatsumi et al.
(Continued)

FOREIGN PATENT DOCUMENTS

CN    101728357 A    6/2010
CN    101728358 A    6/2010

OTHER PUBLICATIONS

Chinese Office Action issued for the corresponding CN application No. 201611073609.7, dated Jun. 16, 2020, 6 pages (for informational purpose only).
(Continued)

*Primary Examiner* — Thanh T Nguyen
(74) *Attorney, Agent, or Firm* — Viering, Jentschura & Partner MBB

(57) ABSTRACT

According to various embodiments, a device may include: a semiconductor region; a metallization layer disposed over the semiconductor region; and a self-organizing barrier layer disposed between the metallization layer and the semiconductor region, wherein the self-organizing barrier layer comprises a first metal configured to be self-segregating from the metallization layer.

19 Claims, 18 Drawing Sheets

(52) U.S. Cl.
CPC .. *H01L 23/53233* (2013.01); *H01L 23/53238* (2013.01); *H01L 23/53266* (2013.01)

(58) Field of Classification Search
CPC ............. H01L 23/532; H01L 23/53238; H01L 23/53266
See application file for complete search history.

(56) References Cited

U.S. PATENT DOCUMENTS

| | | | | |
|---|---|---|---|---|
| 2010/0096755 | A1* | 4/2010 | Tatsumi | H01L 21/76867 257/751 |
| 2015/0235943 | A1* | 8/2015 | Suzumura | H01L 23/5222 257/774 |
| 2015/0262870 | A1* | 9/2015 | Lin | H01L 21/28518 257/751 |
| 2016/0126190 | A1* | 5/2016 | Zhang | H01L 21/76856 257/751 |

OTHER PUBLICATIONS

Chinese Supplementary Search Report issued for corresponding application No. 201611073609.7, dated Oct. 25, 2019, 2 pages (for informational purpose only).

* cited by examiner

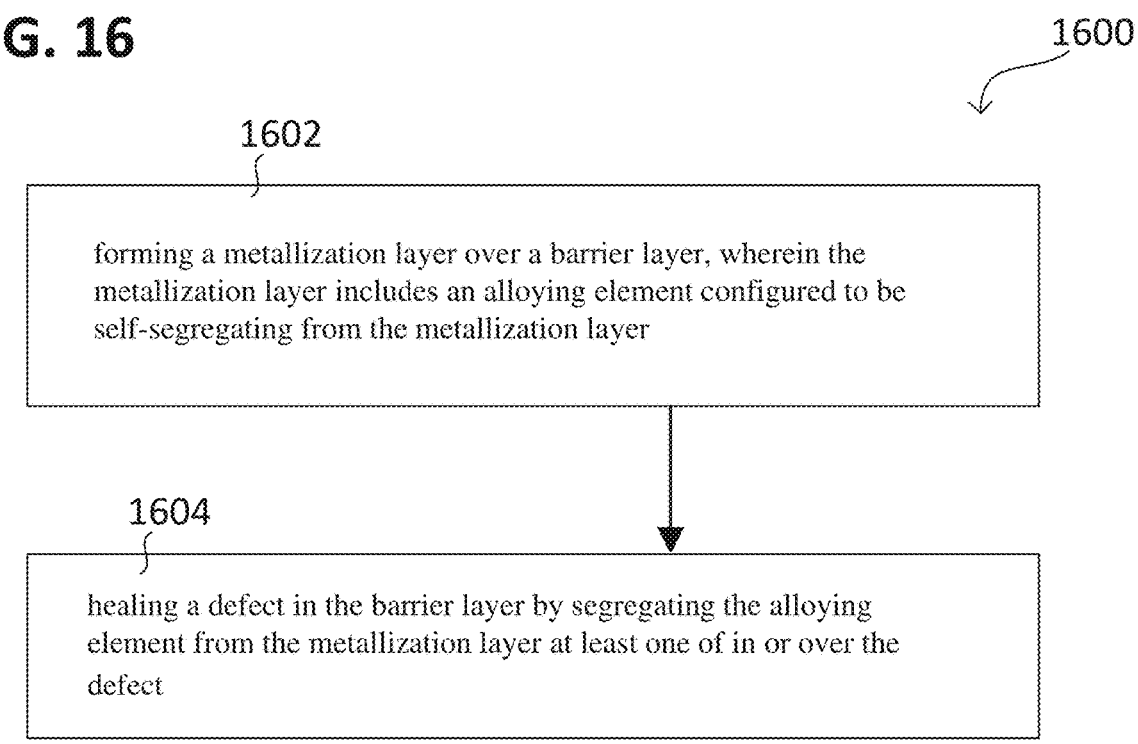

SEMICONDUCTOR DEVICE AND A METHOD OF FORMING THE SEMICONDUCTOR DEVICE

RELATED APPLICATION(S)

This application is a divisional of U.S. patent application Ser. No. 14/953,502, filed Nov. 30, 2015, entitled, "A SELF-ORGANIZING BARRIER LAYER DISPOSED BETWEEN A METALLIZATION LAYER AND A SEMICONDUCTOR REGION", the contents of which are hereby incorporated by reference in their entirety.

TECHNICAL FIELD

Various embodiments relate generally to a semiconductor device and a method of forming the semiconductor device.

BACKGROUND

In general, a semiconductor device may be processed in semiconductor technology, on and/or in a substrate (also referred to as a wafer or a carrier). The substrate may include a plurality of semiconductor devices, e.g. chips, which are processed or mounted in corresponding regions of the substrate. For fabricating such semiconductor devices, certain layers and layer stacks are formed, e.g. electrical interconnections, barriers, and active regions.

Conventionally, certain layer combinations and/or material combinations require a diffusion separation from each other, e.g. if they tend to react with each other. The diffusion separation may be provided by a barrier layer. However, during processing, higher temperatures may increase the reactivity and/or mobility of the atoms such that the barrier layer usually requires a high integrity to prevent diffusion between the respective layers. Defects in the barrier layer, which may arise during the processing, may impair the integrity of the barrier layer and may allow interdiffusion through the barrier layer, which may deteriorate the functionality of the layers, e.g. their capability for providing low resistance electrical connections, or may destroy the semiconductor device. By way of example, during forming the barrier layer, surface contaminations may induce holes in the barrier layer, illustratively acting as an interdiffusion gate. Further, a certain defect density of the barrier layers may decrease the reliability of the barrier layer with increasing interdiffusion area between the layers. By way of example, increasing the interface area between a contact pad and the active area may result in an increase of the failure rate of the produced semiconductor devices.

During processing of the semiconductor device and/or during reliability testing of the semiconductor device, a high temperature may be applied to the semiconductor device, e.g. greater than about 200° C., e.g. greater than about 400° C. This may increase a diffusion activity of material in the semiconductor device increasing a risk of destroying the semiconductor device during processing or testing.

Conventionally, the reliability of the barrier layer may be increased by increasing the number of barrier layers, e.g. by forming a barrier multilayer. Barrier multilayers require a higher effort, more process time, and additional material, which may increase production costs.

The reliability of a barrier multilayer may also decrease with increasing interdiffusion area. Further, defects arising from surface contaminations may extend through all layers of the barrier multilayers and, therefore, may not be reduced by increasing the number of barrier layers.

SUMMARY

According to various embodiments, a device may include: a semiconductor region; a metallization layer disposed over the semiconductor region; and a self-organizing barrier layer disposed between the metallization layer and the semiconductor region, wherein the self-organizing barrier layer includes a first metal configured to be self-segregating from the metallization layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 16 shows a method according to various embodiments in a schematic flow diagram;

DESCRIPTION

Figure 1A:
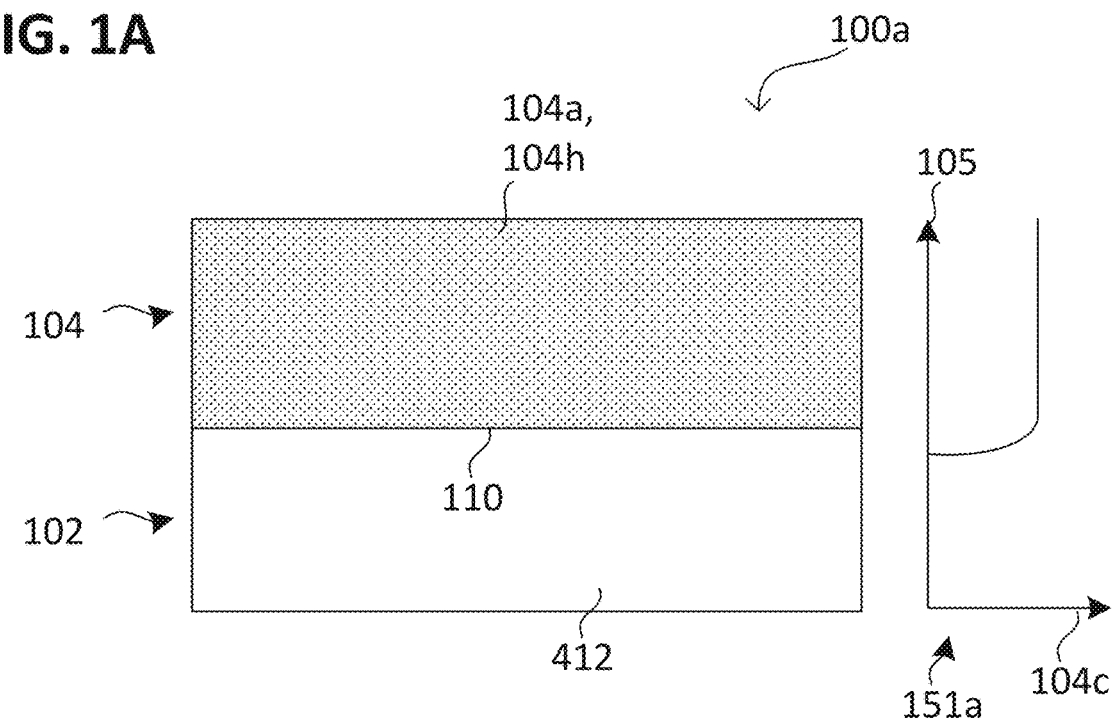
FIGS. 1A and 1B respectively show a semiconductor device according to various embodiments, in a method according to various embodiments in a schematic cross sectional view or side view.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a substrate, a wafer, or a carrier) or "laterally" next to, may be used herein to mean an extension or a positional relationship along a surface of a substrate, a wafer, or a carrier. That means that a surface of a substrate (e.g. a surface of a carrier, or a surface of a wafer) may serve as reference, commonly referred to as the main processing surface of the substrate (or the main processing surface of the carrier or wafer). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a substrate (e.g. perpendicular to the main processing surface of a substrate). The term "thickness" used with regards to a "thickness" of a layer may be used herein to mean the spatial extension of the layer perpendicular to the surface of the support (the material) on which the layer is deposited. If the surface of the support is parallel to the surface of the substrate (e.g. to the main processing surface) the "thickness" of the layer deposited on the support may be the same as the height of the layer. Further, a "vertical" structure may be referred to as a structure extending in a direction perpendicular to the lateral direction (e.g. perpendicular to the main processing surface of a substrate) and a "vertical" extension may be referred to as an extension along a direction perpendicular to the lateral direction (e.g. an extension perpendicular to the main processing surface of a substrate).

According to various embodiments, the semiconductor device may include one or more integrated circuit structures (also referred to as semiconductor chip, IC, chip, or microchip) which are formed during semiconductor device fabrication (in other words, in a method for forming the semiconductor device). An integrated circuit structure may be processed at least partially at least one of over or in a substrate in corresponding regions of the substrate (also referred to as active chip regions) utilizing various semiconductor processing technologies. An integrated circuit structure may include one or more (e.g. a plurality of) semiconductor circuit elements, such among others may be at least one of transistors, resistors, capacitors, which are electrically interconnected and configured to perform operations, e.g. at least one of computing operations, switching operations, rectifier operations, or storage operations, in the completely processed integrated circuit structure, e.g. in power electronics. In further semiconductor device fabrication a plurality of semiconductor devices may be singulated from the substrate (also referred to as a wafer or a carrier) after the semiconductor device processing by wafer-dicing to provide a plurality of singulated semiconductor devices (also referred to as semiconductor chips) from the plurality of semiconductor devices. Further, a final stage of semiconductor device fabrication may include packaging (also referred to as assembly, encapsulation, or seal) of singulated semiconductor devices, wherein a singulated semiconductor device may be encased, e.g. into a supporting material (also referred to as molding material or encapsulation material) to prevent physical damage and/or corrosion of the semiconductor device. The supporting material encases the semiconductor device (illustratively, forms a package or mold) and may optionally support the electrical contacts and/or a lead frame to connect the semiconductor device to a peripheral device, e.g. to a circuit board.

According to various embodiments, during semiconductor device fabrication, various material types may be processed to form at least one of: an integrated circuit structure, a semiconductor circuit element, a contact pad, an electrical interconnection, such among other may be electrically insulating materials, electrically semiconducting materials (also referred to as semiconductor material) or electrically conductive materials (also referred to as electrically conducting materials).

According to various embodiments, a substrate (also referred to as carrier or wafer) may include or be formed from at least one semiconductor material of various types, including a group IV semiconductor (e.g. silicon (Si) or germanium (Ge)), a group III-V semiconductor (e.g. gallium arsenide), or other semiconductor types, including group III semiconductors, group V semiconductors or polymers, for example. In various embodiments, the substrate is made of silicon (doped or undoped), in alternative embodiments, the substrate is a silicon on insulator (SOI) wafer. As an alternative, any other suitable semiconductor material may be used for the substrate, for example semiconductor compound material such as gallium phosphide (GaP), indium phosphide (InP), but also any suitable ternary semiconductor compound material or quaternary semiconductor compound material such as indium gallium arsenide (InGaAs).

A semiconductor material, layer, region or the like may be understood as having moderate electrical conductivity, e.g. an electrical conductivity (measured at room temperature and constant electric field direction, e.g. constant electric field) in the range from about $10^{-6}$ S/m to about $10^6$ S/m. An electrically conductive material, layer, region or the like may be understood as having high electrical conductivity, e.g. an electrical conductivity (measured at room temperature and constant electric field direction, e.g. constant electric field) greater than about $10^6$ S/m, e.g. greater than about $10^7$ S/m. An electrically insulating material, layer, region or the like may be understood as poor high electrical conductivity, e.g. an electrical conductivity (measured at room temperature and constant electric field direction, e.g. constant electric field) less than about $10^{-6}$ S/m, e.g. less than about $10^{-10}$ S/m.

According to various embodiments, a metal refers to a chemical element (e.g. a metalloid, a transition metal, a post-transition metal, an alkali metal or an alkaline earth metal), such as tungsten (W), aluminum (Al), copper (Cu), nickel (Ni), magnesium (Mg), chromium (Cr), iron (Fe), zinc (Zn), tin (Sn), gold (Au), silver (Ag), iridium (Ir), platinum (Pt), indium (In), cadmium (Cd), bismuth (Bi), vanadium (V), titanium (Ti), palladium (Pd), or zirconium (Zr).

A metal alloy may include at least two a metals (e.g. two or more than two metals, e.g. in the case of an intermetallic compound) or at least one metal (e.g. one or more than one metal) and at least one other chemical element (e.g. a non-metal or a half metal). For example, a metal alloy may include or may be formed from at least one metal and at least one non-metal (e.g. carbon (C) or nitrogen (N)), e.g. in the case of steel or a nitride. For example, a metal alloy may include or may be formed from more than one metals (e.g. two or more metals), e.g. various compositions of gold with aluminum, various compositions of copper with aluminum, various compositions of copper and zinc (e.g. "brass") or an various compositions of copper and tin (e.g. "bronze"), e.g. including various intermetallic compounds.

According to various embodiments, a semiconductor device may include an insulated gate bipolar transistor (IGBT). The semiconductor device may further include a metallization layer, e.g. including or formed from copper.

According to various embodiments, potential defects in the at least one barrier layer may be reduced by a self-organizing barrier layer. Illustratively, the self-organizing barrier layer may provide the capability to seal the defects such that the reliability in diffusion separation may be increased. The self-organizing barrier layer may be used instead of or in combination with conventional barrier layers.

According to various embodiments, the metallization layer may include or be formed from a self-segregating composition, e.g. a composition including one or more than one chemical element, e.g. one or more metals. For example, a temperature to which a barrier layer is stable (break down temperature) may be increased by adding a self-segregating alloying element (e.g. manganese) into a metallization layer, e.g. a copper metallization layer. Manganese may segregate from the copper at higher temperatures and may form a self-organizing barrier layer between the copper metallization layer and the semiconductor material (e.g. Si). By way of example, if a conventional barrier layer includes defects, a diffusion of copper into the semiconductor material may be reduced or even substantially eliminated by the manganese and needs much higher temperatures to be activated. Illustratively, the manganese may seal a defect in the conventional barrier layer.

According to various embodiments, the lifetime of the semiconductor device may be increased and a deterioration of the semiconductor device arising from defects (e.g. in a conventionally barrier layer) may be reduced or even substantially eliminated.

A metallization layer, e.g. a contact pad (e.g. including copper), may include an alloying element (also referred to as self-segregating alloying element) which is configured to diffuse to the surface of the metallization layer, e.g. by temperature activated self-segregation. Alternatively or additionally, a tendency of the alloying element to react with the semiconductor material (e.g. silicon), e.g. forming a binary metallic compound of the semiconductor material (e.g. a silicide), may be configured to be low, e.g. minimal. Therefore, a reaction at the interface to the semiconductor material may be suppressed by the alloying element. To reduce a reaction tendency of the of the alloying element with the semiconductor material an electronegativity of the alloying element may be less than an electronegativity of at least one of the host material or the semiconductor material.

According to various embodiments, an electronegativity of a region or material (e.g. of a chemical element in there) may be understood as a chemical property that describes the tendency of an atom of the region or the material to attract electrons (or electron density) towards itself. The electronegativity may be affected by both its atomic number (of a region or material) and the distance at which its valence electrons reside from the charged nucleus. The higher the associated electronegativity of the region or material is, the more a chemical element or a compound of the region or material attracts electrons towards it.

Segregation may be understood to the enrichment of a constituent of a material (e.g. the self-segregating alloying element) at a surface, e.g. a free surface or an internal interface, of the material. The constituent may migrate from a central region of the material to a peripheral region of the material. The migration may be activated by temperature, e.g. above room temperature.

The self-segregating alloying element may be disposed in a host material (e.g. mixed with it) to form a self-segregating composition. The self-segregating composition may be a metastable composition, e.g. above an equilibrium solubility and/or within a miscibility gap. For example, the self-segregating alloying element may be soluble in the host material up to the equilibrium solubility, wherein the self-segregating composition may include a concentration of the self-segregating alloying element greater than the equilibrium solubility.

The alloying element and the host material may differ from each other in at least one of: a bulk crystal structure (e.g. in the range from about room temperature to about the segregation temperature, e.g. to about 400° C.), an atomic radius of more than 15%, an electronegativity of more than 15%.

Furthermore, the self-segregating composition may include at least one of more than one phase, an eutectic, or a miscibility gap.

Figure 1B:
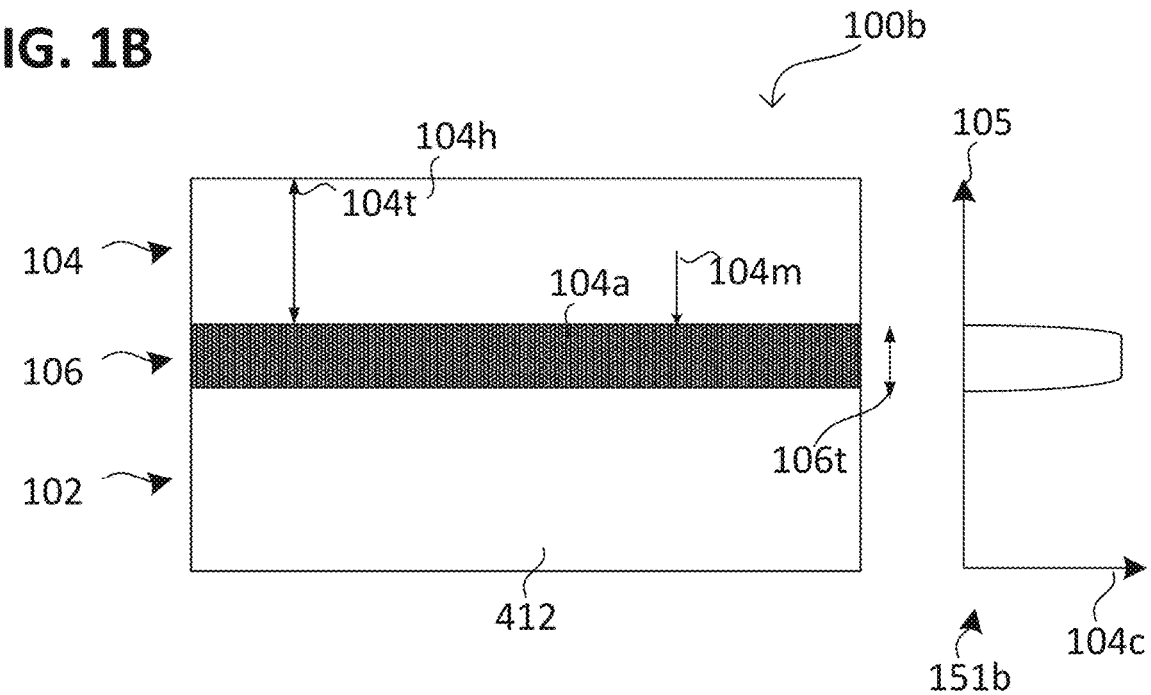

FIG. 1A and FIG. 1B illustrate a semiconductor device according to various embodiments, in a method according to various embodiments in a schematic cross sectional view or side view.

The method may include in 100$a$ forming a metallization layer 104 over a semiconductor region 102. The metallization layer 104 may include or be formed from a self-segregating composition 104$a$, 104$h$. A physical vapor deposition, e.g. sputtering, may be used for forming the metallization layer 104.

The self-segregating composition may include or be formed from a host material and an alloying element 104$a$ (self-segregating alloying element 104$a$). The alloying element 104$a$ may include or be formed from a first metal. Alternatively or additionally, the host material may include or be formed from a second metal, e.g. different from the first metal.

The self-segregating composition 104$a$, 104$h$ may be disposed stoichiometric. Alternatively or additionally, the self-segregating composition 104$a$, 104$h$ may include or be formed from alternating sublayers differing in their stoichiometry (e.g. alloying element rich or host material rich).

In a schematic diagram 151$a$, a concentration 104$c$ (e.g. an atomic concentration) of the alloying element 104$a$ is illustrated over a vertical position 105 before activating a segregation. The concentration 104$c$ of the alloying element 104$a$ in the metallization layer 104 may be at least one of substantially homogeneous in the metallization layer 104

(e.g. less than 30% variation), or greater than a concentration 104c of the alloying element 104a in the semiconductor region 102.

The metallization layer 104 may be in physical contact to the semiconductor region 102, e.g. at an interface 110. Alternatively or additionally, at least one further barrier layer may be formed between the metallization layer 104 and the semiconductor region 102 (see FIG. 2A).

The method may include, in 100b, activating a segregation of the alloying element 104a from the self-segregating composition 104a, 104h to form a self-organizing barrier layer 106 between the metallization layer 104 (e.g. the host material 104h) and the semiconductor region 102 (e.g. the semiconductor material 412). Activating the segregation may include activating a migration 104m of the alloying element 104a into a direction of the interface 110 between the metallization layer 104 and the semiconductor region 102. Alternatively or additionally, activating the segregation may include reducing a concentration (e.g. spatially averaged) of the alloying element 104a in the metallization layer 104. Alternatively or additionally, activating the segregation may include enriching the alloying element 104a between the metallization layer 104 (e.g. the host material 104h) and the semiconductor region 102 (e.g. the semiconductor material 412).

In a schematic diagram 151b a concentration 104c (e.g. an atomic concentration) of the alloying element 104a is illustrated over a vertical position 105 after activating the segregation. The concentration 104c of the alloying element 104a in the metallization layer 104 may be at least one of greater than a concentration 104c of the alloying element 104a in the semiconductor region 102, or greater than a concentration 104c of the alloying element 104a in the metallization layer 104.

A concentration (first concentration, e.g. spatially averaged) of the alloying element 104a in the metallization layer 104 (e.g. in the self-segregating composition) before the activating the segregation may be greater than a concentration (second concentration, e.g. spatially averaged) of the alloying element 104a in the metallization layer 104 (e.g. in the self-segregating composition) after the activating the segregation. Alternatively or additionally, at least one of the first concentration or the second concentration may be less than a concentration (third concentration, e.g. e.g. spatially averaged) of the alloying element 104a in the self-organizing barrier layer 106.

The first concentration (e.g. spatially averaged) may be in the range from about 0.5 atomic percent (at %) to about 50 at %, e.g. in the range from about 1 at % to about 40 at %, e.g. in the range from about 2 at % to about 30 at %, e.g. in the range from about 5 at % to about 25 at %, e.g. in the range from about 5 at % to about 20 at %, e.g. about 10 at %.

Alternatively or additionally, a concentration of the self-segregating composition in the self-segregating composition in the metallization layer 104 may be greater than about 70 at %, e.g. greater than about 80 at %, e.g. greater than about 90 at %, e.g. greater than about 95 at %, e.g. greater than about 99 at %, e.g. about 100 at %. In other words, the metallization layer 104 may be substantially formed from the self-segregating composition.

The second concentration (e.g. spatially averaged) may be less than about 50 at %, e.g. less than about 40 at %, e.g. less than about 30 at %, e.g. less than about 20 at %, e.g. less than about 10 at %, e.g. less than about 5 at %, e.g. less than about 2 at %, e.g. less than about 0.5 at %, e.g. less than about 0.1 at %.

The third concentration (e.g. spatially averaged) 106 may be greater than about 70 at %, e.g. greater than about 80 at %, e.g. greater than about 90 at %, e.g. greater than about 95 at %, e.g. greater than about 99 at %, e.g. about 100 at %. In other words, the self-organizing barrier layer 106 may be substantially formed from the alloying element 104a.

Alternatively or additionally, the self-organizing barrier layer 106 may be substantially formed from a compound (also referred to as barrier compound) including the alloying element 104a and a semiconductor (also referred to as semiconductor material) of the semiconductor region. In other words, a concentration of at least one of the barrier compound (or a sum of the barrier compound and the alloying element 104a) in the self-organizing barrier layer 106 may be greater than about 70 at %, e.g. greater than about 80 at %, e.g. greater than about 90 at %, e.g. greater than about 95 at %, e.g. greater than about 99 at %, e.g. about 100 at %. For example, the barrier compound may include or be formed from a binary metallic compound of the semiconductor material, e.g. a silicide.

The alloying element 104a may include or be formed from at least one of: manganese, tantalum, chromium, tungsten, and/or molybdenum.

A thickness 104t of the metallization layer 104 (e.g. at least one of before the activating the segregation or after the activating the segregation) may be greater than about ten times a thickness 106t of the self-organizing barrier layer 106, e.g. greater than about twenty times a thickness 106t of the self-organizing barrier layer 106, e.g. greater than about thirty times a thickness 106t of the self-organizing barrier layer 106, e.g. greater than about fifty times a thickness 106t of the self-organizing barrier layer 106, e.g. greater than about hundred times a thickness 106t of the self-organizing barrier layer 106.

The thickness 104t of the metallization layer 104 may decrease during the activating the segregation. In other words, the thickness 104t of the metallization layer 104 before the activating the segregation may be greater than the thickness 104t of the metallization layer 104 after the activating the segregation).

The thickness 106t of the self-organizing barrier layer 106 may increase during the activating the segregation.

Furthermore, the thickness 106t of the self-organizing barrier layer 106 may be in the range from about 1 nanometer (nm) to about 50 nm, e.g. in the range from about 1 nm to about 20 nm, e.g. greater than about 2 nm, e.g. greater than about 5 nm, and/or less than about 15 nm, e.g. less than about 10 nm.

According to various embodiments, the thickness 104t of the metallization layer 104 may be in the range from about 100 nm to about 1 micrometer (m), e.g. greater than about 200 nm, e.g. greater than about 250 nm, and/or less than about 0.75 μm, e.g. less than about 0.5 μm.

Alternatively or additionally, activating the segregation may include forming a concentration gradient of the alloying element 104a in the metallization layer 104 pointing into the direction of the semiconductor region 102.

According to various embodiments, the self-organizing barrier layer 106 may be in physical contact to at least one of the metallization layer 104 or the semiconductor region 102.

According to various embodiments, at least one of the alloying element 104a or the self-segregating composition 104a, 104h may be configured such that a segregation of the alloying element 104a from the metallization layer 104 (e.g. the host material 104h) starts at a lower temperature than a reaction of the metallization layer 104 (e.g. the host material 104*h*) with the semiconductor region 102 (e.g. the semiconductor material). In other words, a temperature activating a segregation (also referred to as segregation temperature) of the alloying element from the metallization layer may be less than a temperature activating a reaction (also referred to as reaction temperature) of the metallization layer 104 (e.g. the host material 104*h*) with the semiconductor region 102 (e.g. the semiconductor material).

Alternatively or additionally, at least one of the alloying element 104*a* or the self-segregating composition 104*a*, 104*h* may be configured such that a layer formation velocity (thickness 106*t* per time) of the self-organizing barrier layer 106 is greater than a layer formation velocity driven by a reaction of the metallization layer 104 (e.g. the host material 104*h*) with the semiconductor region 102 (e.g. the semiconductor material). In other words, the alloying element 104*a* may be configured to segregate from the metallization layer 104 (e.g. the host material 104*h*) faster than the metallization layer 104 (e.g. the host material 104*h*) chemically reacts with the semiconductor region 102 (e.g. the semiconductor material).

The segregation temperature may be less than about 400° C., e.g. less than about 350° C., e.g. less than about 300° C., e.g. less than about 250° C., e.g. less than about 200° C., e.g. less than about 190° C., e.g. less than about 180° C., e.g. less than about 170° C., e.g. less than about 160° C., e.g. less than about 150° C., alternatively or additionally (and/or), more than about room temperature, e.g. more than about 100° C.

The method may include, in 100*b*, heating the metallization layer 104 to a temperature greater than the segregation temperature to activate the segregation of the alloying element 104*a* from the metallization layer 104 (e.g. the host material 104*h*).

Figure 2A:
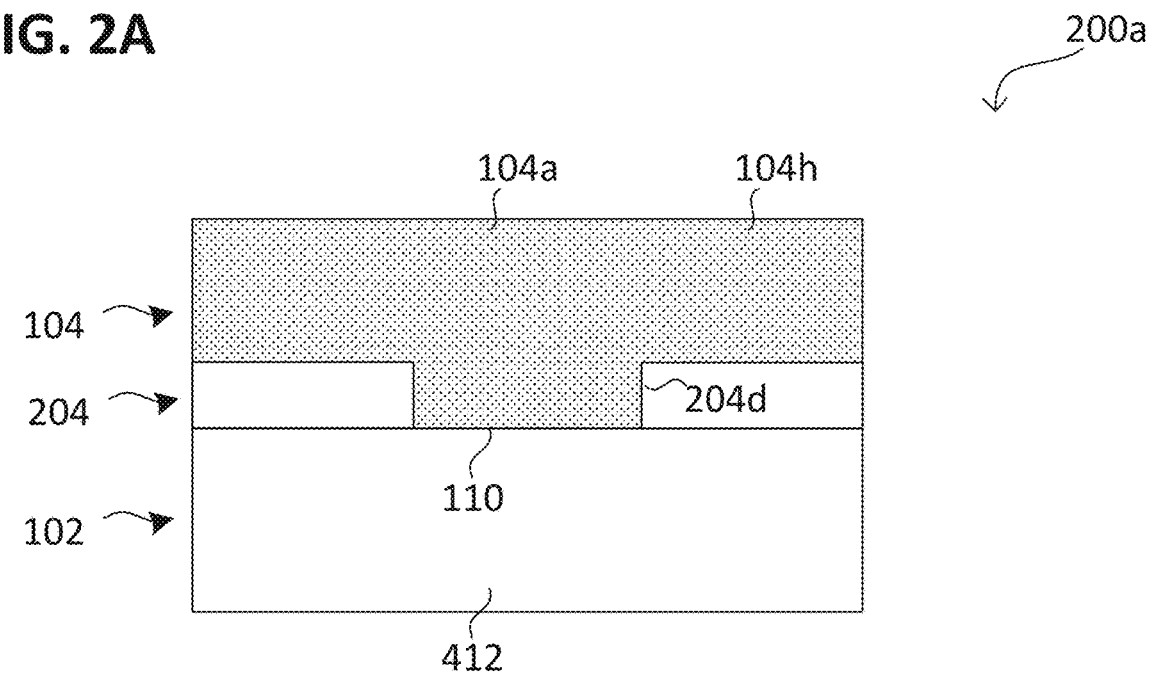
FIGS. 2A and 2B respectively show a semiconductor device according to various embodiments, in a method according to various embodiments in a schematic cross sectional view or side view.
Figure 2B:
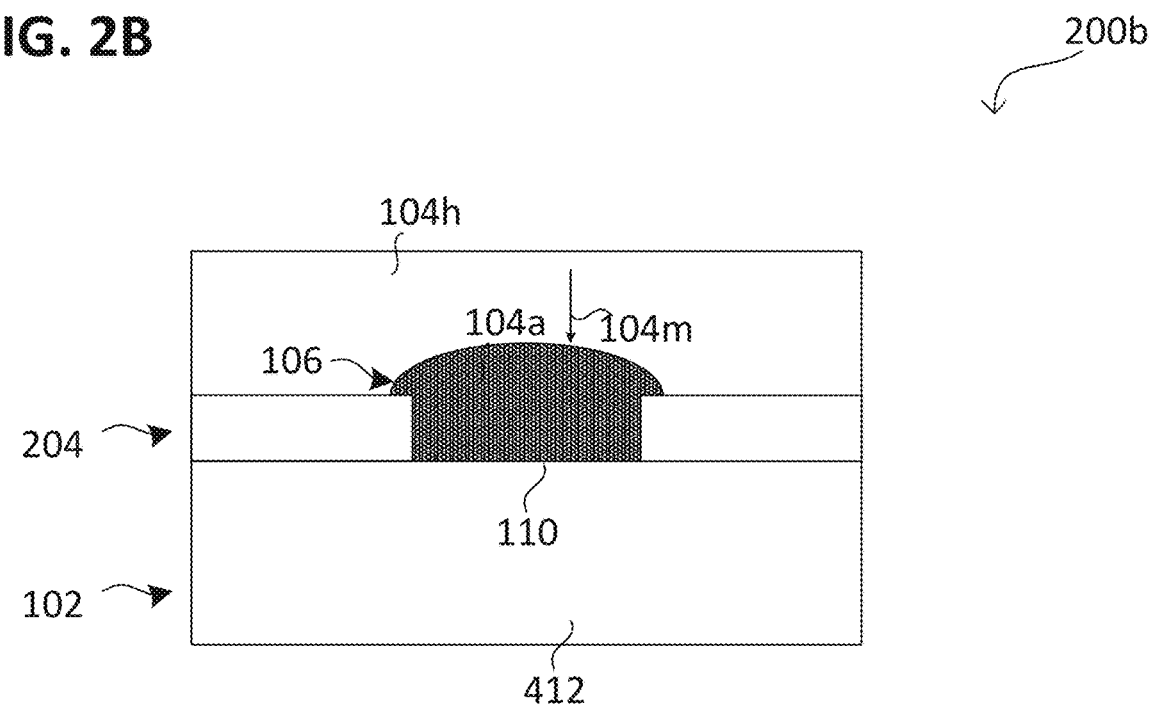

FIG. 2A and FIG. 2B illustrate a semiconductor device according to various embodiments, in a method according to various embodiments in a schematic cross sectional view or side view.

The method may include, in 200*a*, forming at least one further barrier layer 204 (in other words, one or more further barrier layers 204) between the metallization layer 104 and the semiconductor region 102. The metallization layer 104 may be formed over the at least one further barrier layer 204.

The at least one further barrier layer 204 may include or be formed from a barrier layer stack. For example, the at least one further barrier layer 204 may be formed using at least one of physical vapor deposition (PVD), e.g. sputtering, or chemical vapor deposition (CVD).

The at least one further barrier layer 204 may include or be formed from at least one of titanium or tungsten.

By way of example, the at least one further barrier layer 204 may include or be formed from at least one of the following layers: a first barrier layer including or formed from titanium and tungsten (e.g. by PVD), a second barrier layer including or formed from tungsten (e.g. by CVD) and a third barrier layer including or formed from titanium and tungsten (e.g. by PVD). By way of example, the second barrier layer may be disposed between the first and third barrier layer.

If the at least one further barrier layer 204 includes one or more defects 204*d*, a separation efficiency of the at least one further barrier layer 204 may be reduced in the one or more defects 204*d*. By way of example, the one or more defects 204*d* may include or be formed from one or more openings through which at least one of the metallization layer 104 (e.g. the host material 104*h*) may physically contact the semiconductor region 102, the host material 104*h* migrates through or the semiconductor material 412 migrates through.

According to various embodiments, the method may include, in 200*b*, sealing (also referred to as healing) the one or more defects 204*d* by segregating the alloying element 104*a* from the metallization layer 104 at least one of in or on the one or more defects 204*d*. The self-organizing barrier layer 106 may include or be formed from at least one of the alloying element 104*a* or the barrier compound. The self-organizing barrier layer 106 may be formed at least one of in or on the one or more defects 204*d*.

The segregation may be activated as described before, e.g. by heating the metallization layer 104 over the segregation temperature.

The self-organizing barrier layer 106 may be in physical contact to at least one of the metallization layer 104, the at least one further barrier layer 160 or the semiconductor region 102. At least one of the self-organizing barrier layer 106 or the at least one further barrier layer 204 may separate the metallization layer 104 (e.g. the host material 104*h*) from the semiconductor region 102.

Figure 3A:
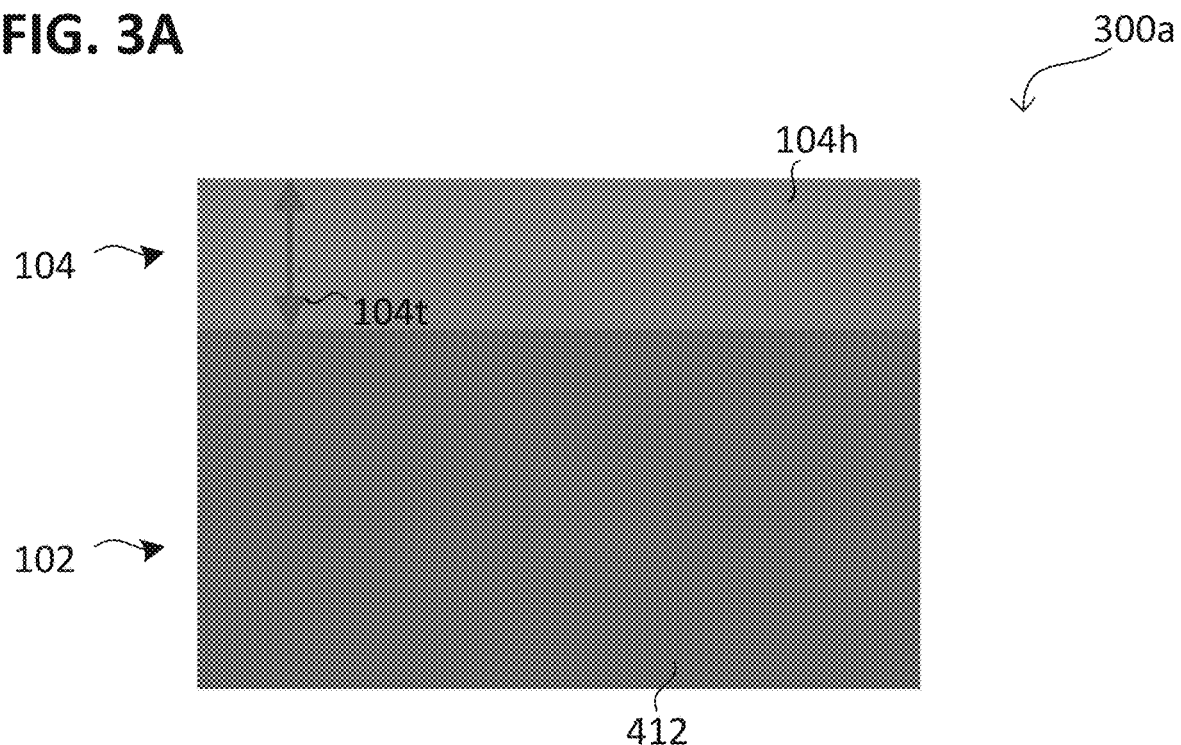
FIGS. 3A and 3B respectively show a semiconductor device according to various embodiments, in a method according to various embodiments in a schematic cross sectional view or side view.
Figure 3B:
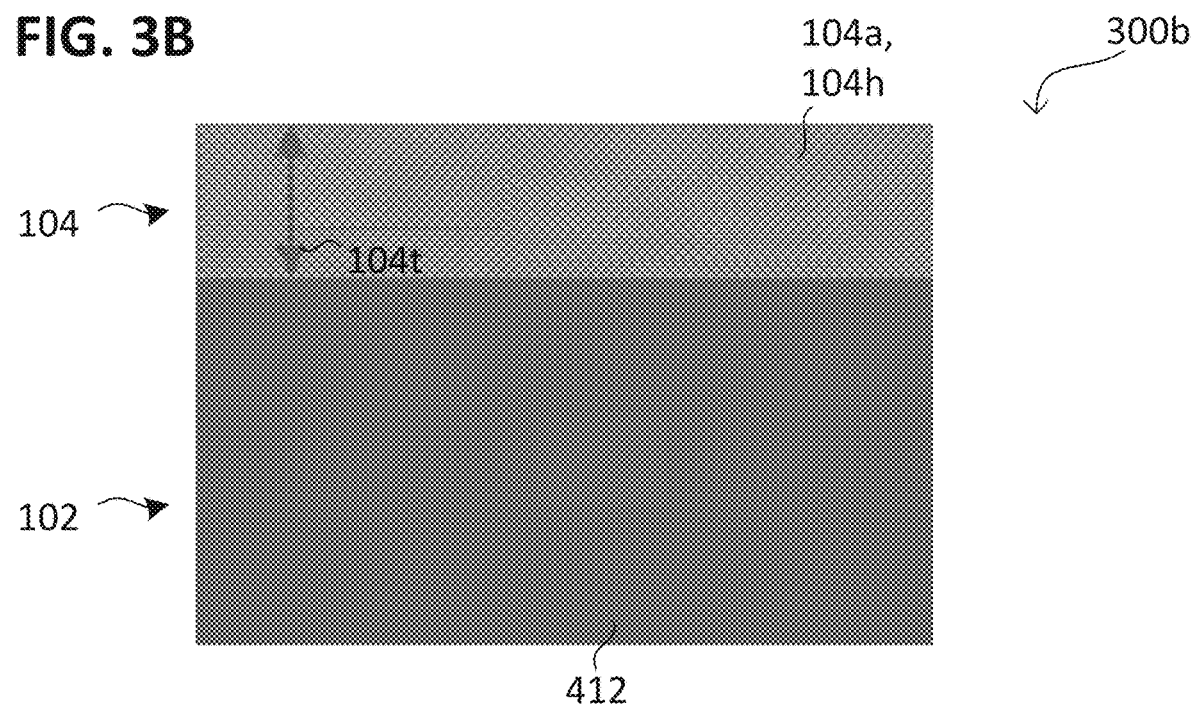

FIG. 3A and FIG. 3B respectively illustrate a semiconductor device according to various embodiments, in a method according to various embodiments in a schematic cross sectional view or side view.

The semiconductor region 102 may be part of a wafer, e.g. a silicon wafer.

The method may include, in 300*a* and in 300*b*, cleaning the semiconductor region 102, e.g. by chemical wet etching. Alternatively or additionally, the method may include in 300*a* and in 300*b* exposing the semiconductor material 412 of the semiconductor region 102, e.g. by removing a native oxide of the semiconductor material from the semiconductor region 102. By way of example, exposing the semiconductor material may include at least one of plasma etching (e.g. in argon) or sputter etching (also referred to as Sputter-Preclean).

The method may further include, in 300*a*, forming a metallization layer 104, e.g. from copper, on the semiconductor region 102 (e.g. free of the alloying element 104*a*), e.g. by sputtering copper on the semiconductor region 102.

The method may further include, in 300*b*, forming a metallization layer 104, e.g. from a copper-manganese alloy, on the semiconductor region 102, e.g. by sputtering the copper-manganese alloy on the semiconductor region 102. A concentration of manganese in the copper-manganese alloy may be about 10 at. %.

The method may include, in 300*a* and 300*b*, heating the semiconductor device, e.g. for further processing. During the heating the semiconductor device, a chemical analysis (e.g. secondary ion mass spectrometry) may reveal at least one of the segregation temperature or the reaction temperature. Alternatively or additionally, a resistivity measurement may reveal a formation of a binary metallic compound disposed between the metallization layer 104 and the semiconductor region 102, e.g. a silicide formation, and therefore may indicate the reaction temperature.

Figure 4A:
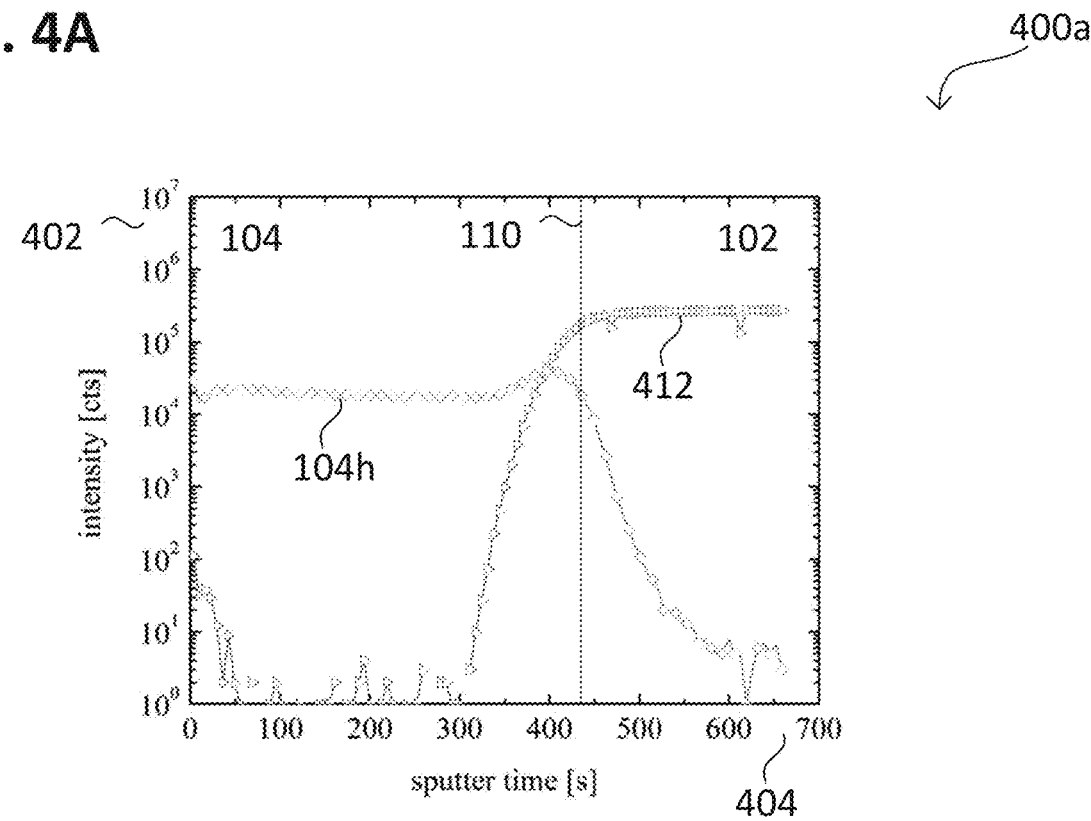
FIGS. 4A and 4B respectively show a schematic diagram.
Figure 4B:
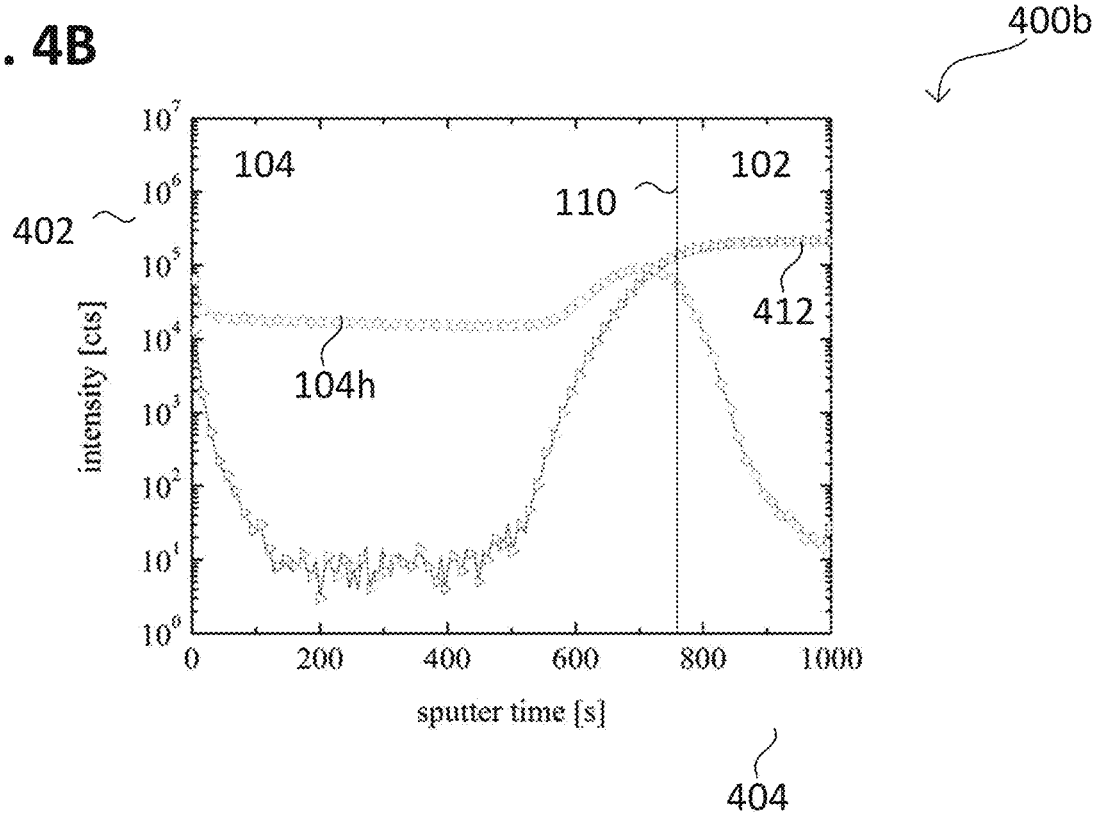

FIG. 4A and FIG. 4B respectively show a diagram 400*a* illustrating a chemical analysis of a region including the interface 110 (marked by a line at its estimated position for orientation) between the metallization layer 104 and the semiconductor region 102 by secondary ion mass spectrometry. The diagram 400*a* illustrates an intensity parameter 402 representing counts of secondary electrons which indicate a concentration (e.g. atomic concentration) over a sputter time parameter 404 representing depth position 105.

The method may include disposing a metallization layer 104 over the semiconductor region 102. The metallization layer 104 may include or be formed from the host material 104h. The semiconductor region 102 may include or be formed from the semiconductor material 412. The metallization layer 104 and the semiconductor region 102 may be free of any interdiffusion, indicated by the sharp drop of the concentrations 402 at the interface 110. The metallization layer 104 may be substantially free of the semiconductor material 412 of the semiconductor region 102. The semiconductor region 102 may be substantially free of the host material 104h.

The method may include heating the metallization layer 104 for 45 minutes at 180° C. (as shown in a diagram 400b). As visible from the comparison, a concentration of the host material 104h proximate the interface 110 may increase due to a temperature activated interdiffusion of the host material 104h and the semiconductor material 412. In other words, the metallization layer 104 and the semiconductor region 102 may partially diffuse into each other, indicated by the broadened drop of the concentrations 402 at the interface 110.

Figure 5A:
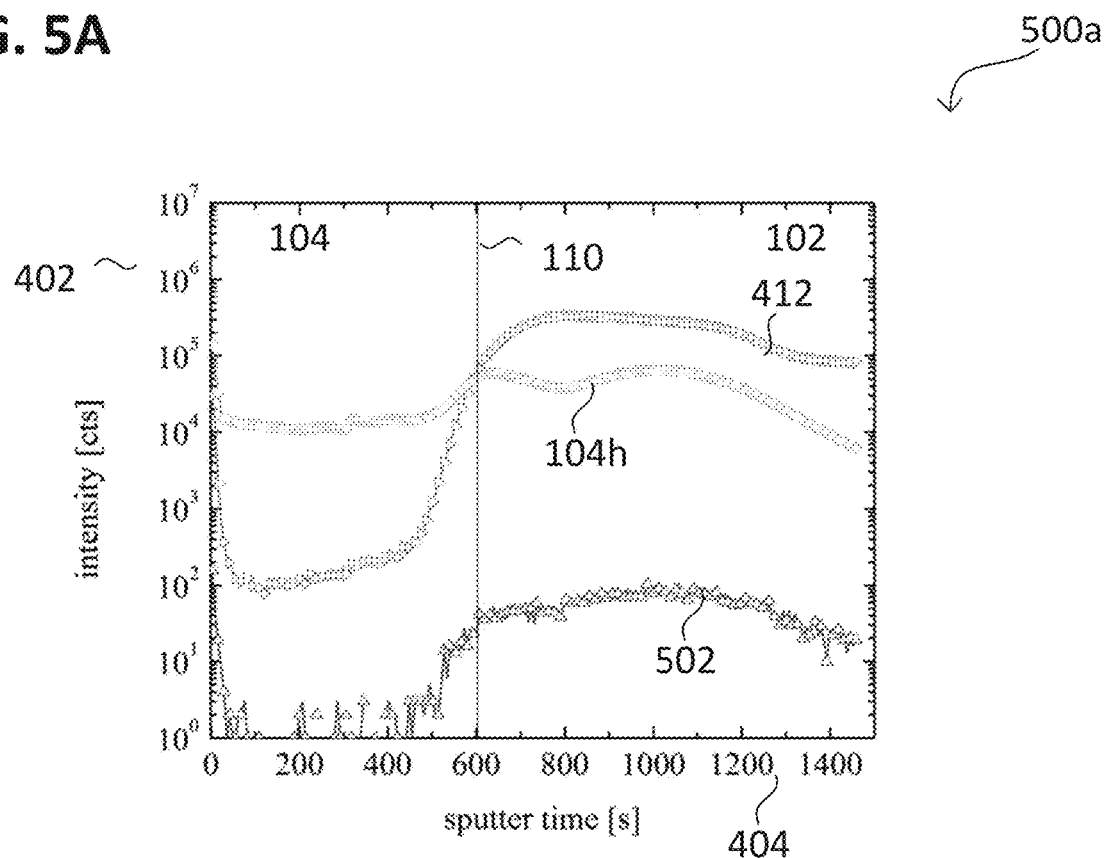
FIGS. 5A and 5B respectively show a schematic diagram.
Figure 5B:
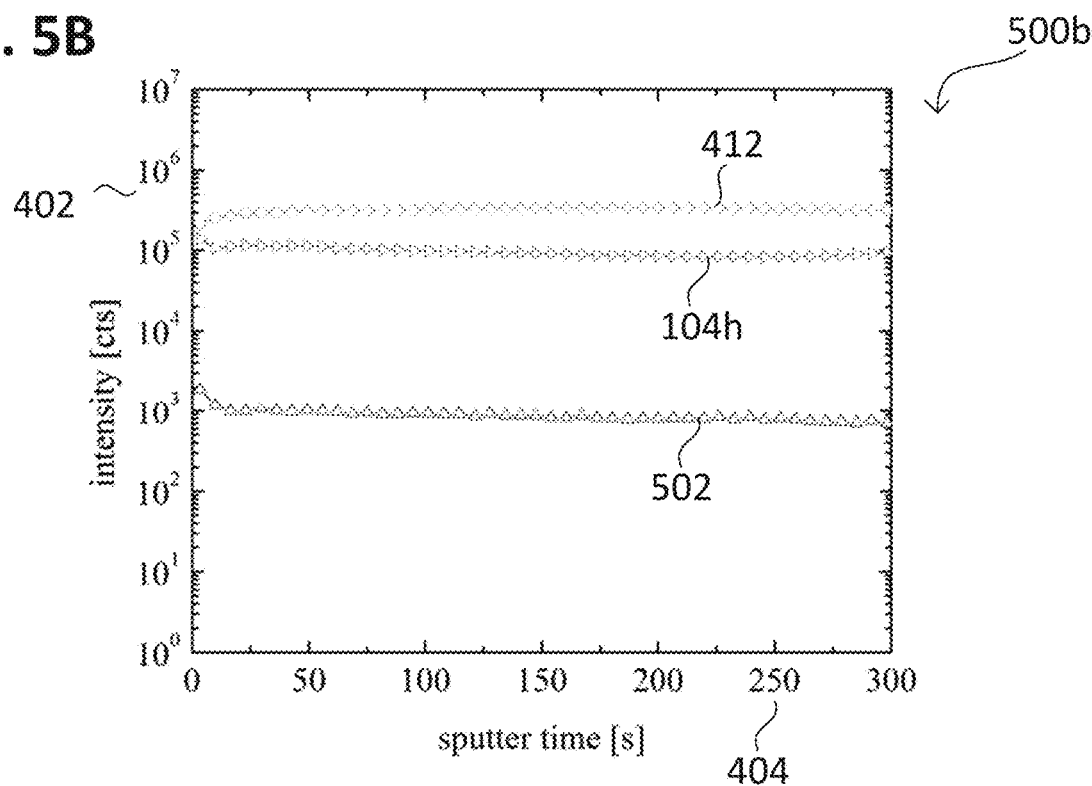

FIG. 5A and FIG. 5B respectively show a schematic diagram, similar to FIG. 4A and FIG. 4B.

As shown in a diagram 500a in FIG. 5A, the method may include heating the metallization layer 104 for 90 minutes at 180° C. As visible from the comparison, the semiconductor material 412 may be migrated into the metallization layer 104 and the host material 104h may be migrated into the semiconductor region 102. The line 502 may represent a reaction product 502 (also referred to as reaction compound 502) of the semiconductor material 412 with the host material 104h, e.g. a binary metallic compound of the semiconductor material (e.g. copper silicide). This may indicate a chemical reaction starting proximate the interface 110. The formation of the reaction compound 502 may also be indicated may the double maximum in the concentration 402 of the host material 104h proximate the interface 110, indicating a local enrichment of the host material 104h defined by the stoichiometry of reaction compound 502.

As shown in a diagram 500b in FIG. 5B, the method may include heating the metallization layer 104 for 30 minutes at 200° C. As visible from the comparison, the semiconductor material 412 with the host material 104h may be fully reacted to the reaction compound 502 (e.g. copper silicide). This may also be indicated by the homogeneous distribution of host material 104h and the semiconductor material 412, illustratively fixed by the stoichiometry of the reaction compound 502.

As illustrated in FIG. 4A and FIG. 4B, the reaction temperature may be less than 200° C., e.g. about 180° C.

Figure 6A:
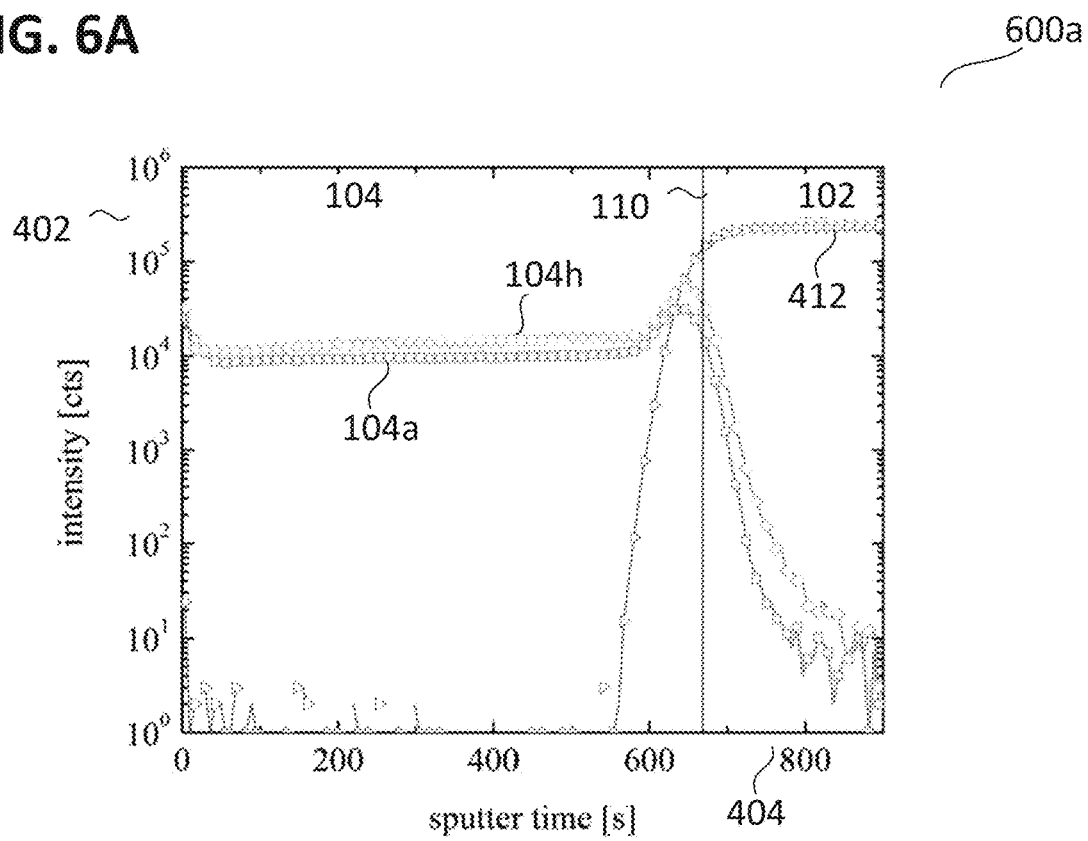
FIGS. 6A and 6B respectively show a schematic diagram.
Figure 6B:
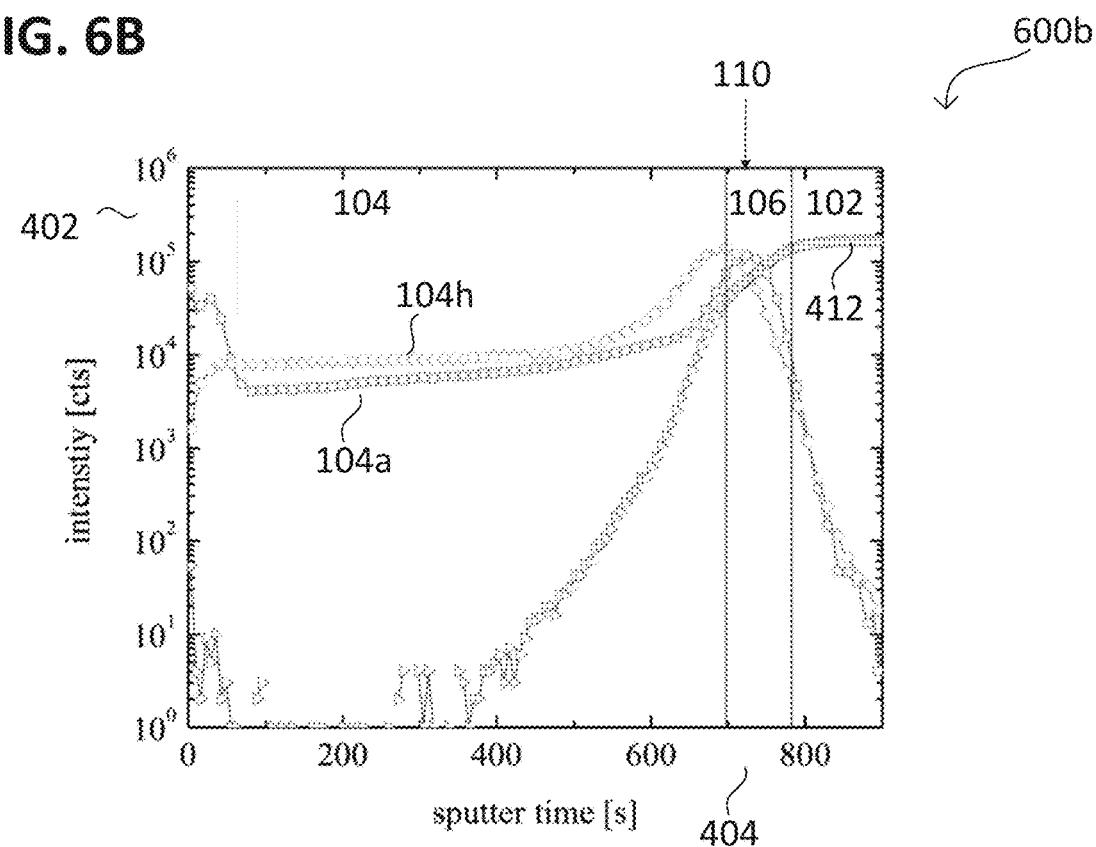

FIG. 6A and FIG. 6B respectively show a schematic diagram, similar to FIG. 4A and FIG. 4B.

As shown in a diagram 600a in FIG. 6A, the method may include disposing a metallization layer 104 over the semiconductor region 102. The metallization layer 104 may include or be formed from the host material 104h and the alloying element 104a, e.g. a homogeneous self-segregating composition of the host material 104h and the alloying element 104a. The semiconductor region 102 may include or be formed from the semiconductor material 412. The metallization layer 104 and the semiconductor region 102 may be free of any interdiffusion, indicated by the sharp drop of the concentrations 402 at the interface 110. The metallization layer 104 may be substantially free of the semiconductor material 412 of the semiconductor region 102. The semiconductor region 102 may be substantially free of the host material 104h.

As shown in a diagram 600b in FIG. 5B, the method may include heating the metallization layer 104 for 30 minutes at 200° C., similar to 500b. As visible from the comparison, a concentration of the host material 104h and the alloying element 104a proximate the initial interface may be more stable than for 500b. As indicated by the deviated maximum in the concentration of the host material 104h and the alloying element 104a, the alloying element 104a is migrated towards the semiconductor region 102, e.g. due to a temperature activated segregation of the alloying element 104a from the host material 104h. In other words, the alloying element 104a segregates from the metallization layer 104. The alloying element 104a may form a chemically stable interlayer 106 (also referred to as self-organizing barrier layer 106). The interlayer 106 may effectively separate the host material 104h from the semiconductor material 412 and may be configured to act as diffusion barrier.

An interface of the self-organizing barrier layer 106 and the semiconductor region 102 may be substantially free of the host material 104h. An interface of the self-organizing barrier layer 106 and the metallization layer 104 may be substantially free of the semiconductor material 412. The metallization layer 104 may be substantially free of the semiconductor material 412 of the semiconductor region 102 after the activating the segregation. The semiconductor region 102 may be substantially free of the host material 104h after the activating the segregation.

Figure 7A:
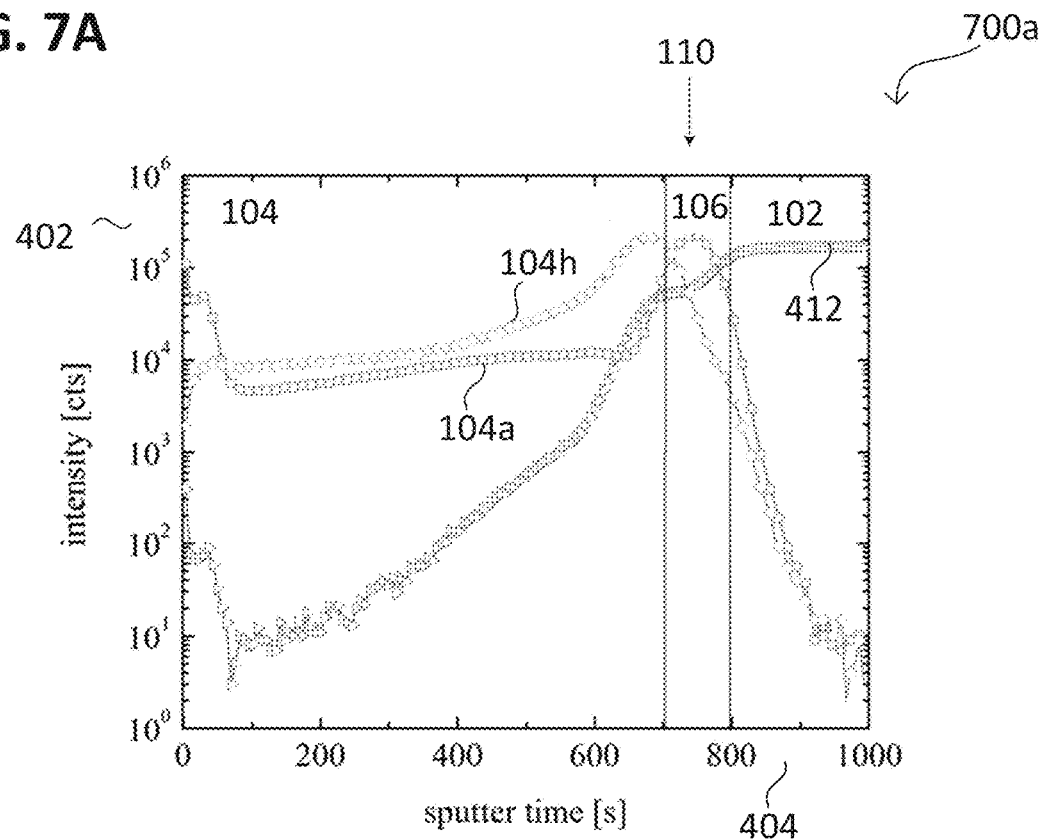
FIGS. 7A and 7B respectively show a schematic diagram.
Figure 7B:
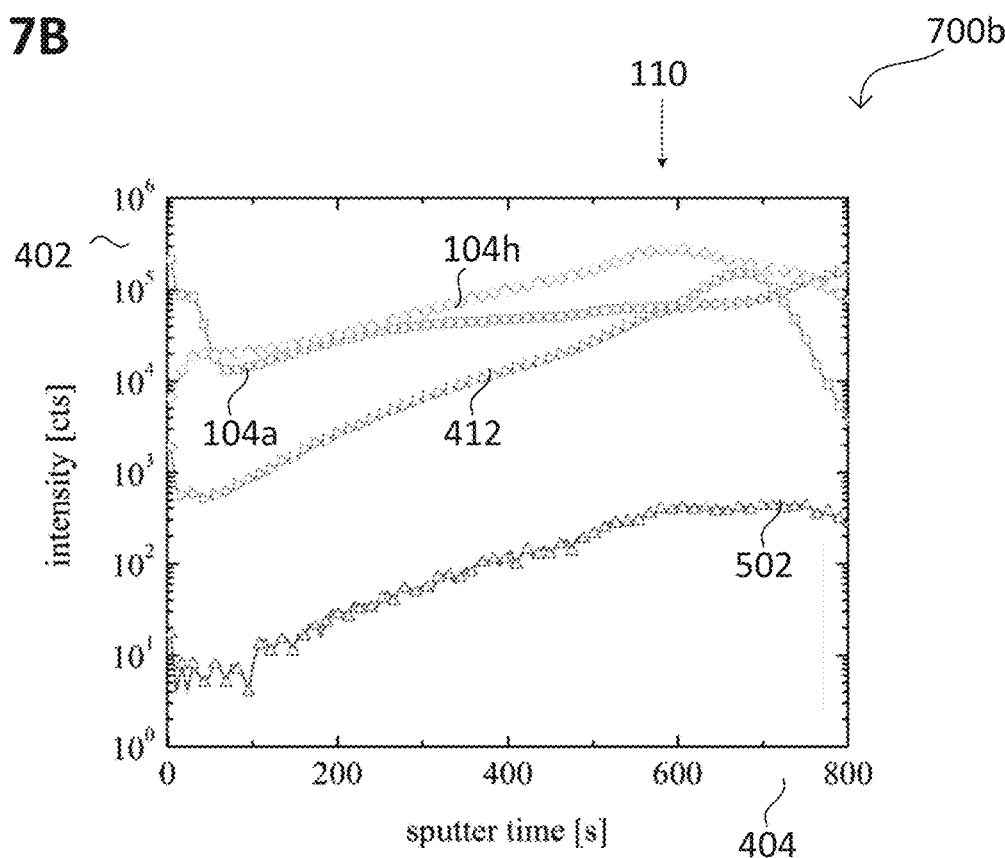

FIG. 7A and FIG. 7B respectively show a schematic diagram, similar to FIG. 4A and FIG. 4B.

As shown in a diagram 700a in FIG. 7A, the method may include heating the metallization layer 104 for 90 minutes at 220° C. As visible from the comparison, a concentration of the host material 104h and the alloying element 104a proximate the initial interface 110 may be more stable than for 500b. As indicated by the deviation of the maximum concentration of the host material 104h and the alloying element 104a, the alloying element 104a is migrated towards the semiconductor region 102, e.g. due to a temperature activated segregation of the alloying element 104a from the host material 104h. The interlayer 106 may effectively separate the host material 104h from the semiconductor material 412 and may be configured to act as diffusion barrier.

An interface of the self-organizing barrier layer 106 and the semiconductor region 102 may be substantially free of the host material 104h. There may occur a small diffusion of the semiconductor material into the metallization layer 104. However, a concentration of the semiconductor material 412 in metallization layer 104 may be within a solubility range defined by the semiconductor material 412 and the metallization layer 104. The solubility range may include a maximum, also referred to as solubility limit. The concentration of the semiconductor material 412 in metallization layer 104 may be less than the solubility limit of the semiconductor material 412 in the host material 104h. Therefore, substantially no reaction of the semiconductor material 412 with the host material 104h may be activated.

As shown in a diagram 700b in FIG. 7B, the method may include heating the metallization layer 104 for 30 minutes at 240° C. As visible from the comparison, the semiconductor material 412 and the host material 104h may be reacted partially to the reaction compound 502, e.g. a binary metallic compound 502 of the semiconductor material (e.g. copper silicide). This may indicate that the interface layer 106 is broken down.

As illustrated, the break down temperature of the self-organizing barrier layer 106 may be greater than the reaction temperature, e.g. by a minimum of 20° C., e.g. by a range from about 40° C. to about 60° C.

Figure 8A:
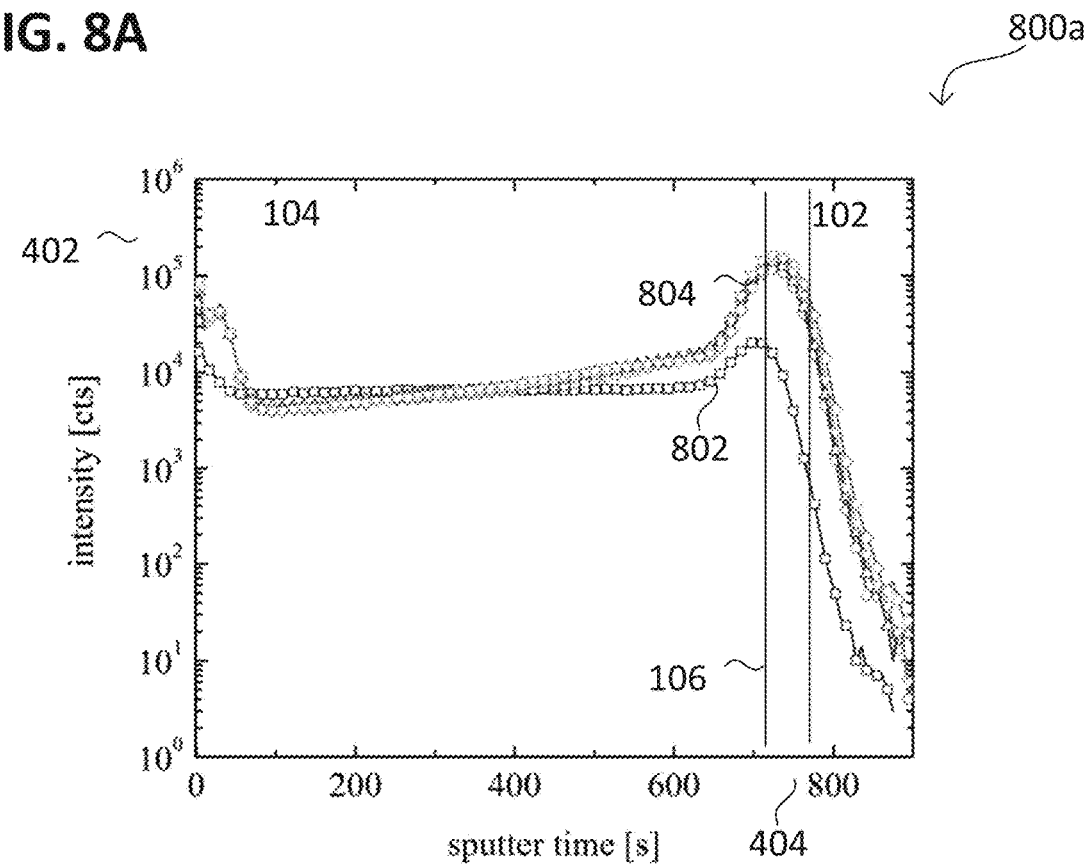
FIGS. 8A and 8B respectively show a schematic diagram.
Figure 8B:
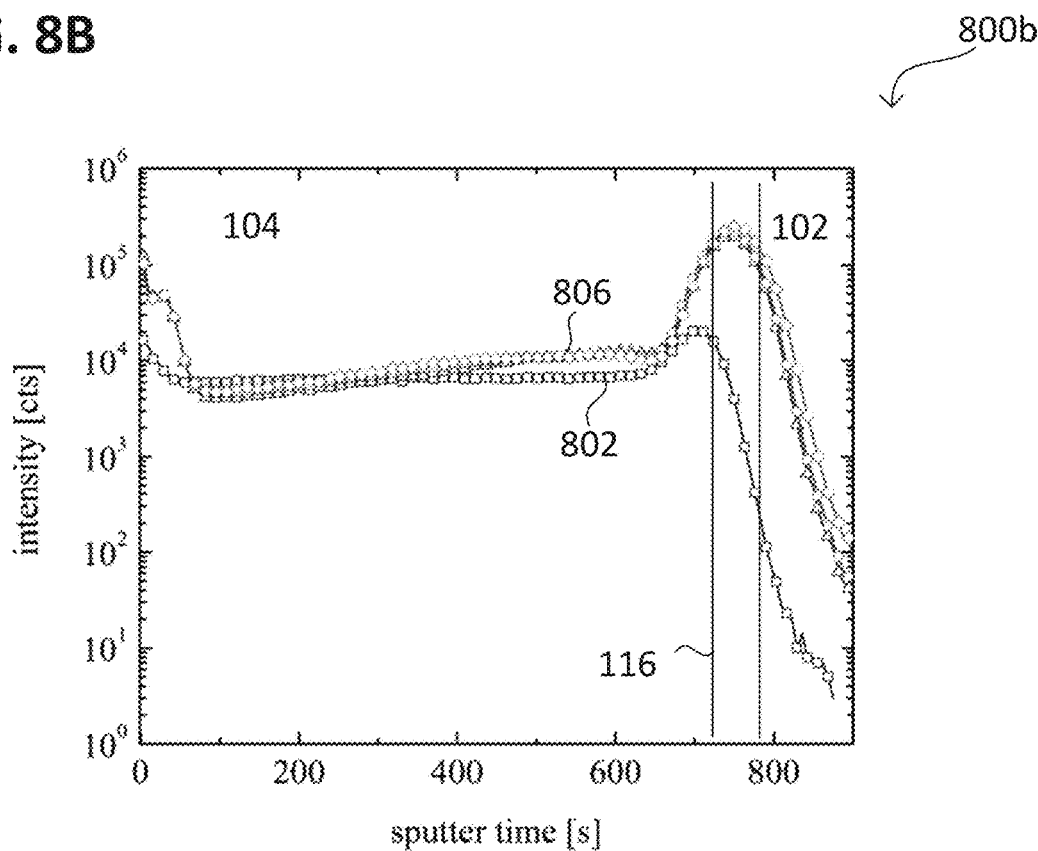

FIG. 8A and FIG. 8B respectively show a schematic diagram, similar to FIG. 4A and FIG. 4B.

As shown in a diagram 800a in FIG. 8A, the method may include heating the metallization layer 104 to activate a segregation of the alloying element 104a from the host material 104h. FIG. 8A illustrates a comparison of the spatially distributed concentration 402 of the alloying element 104a for various heating times at 200° C., indicating a layer formation velocity (thickness per time) of the self-organizing barrier layer 106 driven by the self-segregation.

The line 802 illustrates the spatially distributed concentration 402 of the alloying element 104a before heating. The line 804 illustrates the spatially distributed concentration 402 of the alloying element 104a after heating for various times in the range from about 30 minutes to about 75 minutes. As visible, no significant change is noticeable between the various heating times, indicating that a full equilibrium (of the formation of the self-organizing barrier layer 106) is reached by less than about 30 minutes.

As shown in a diagram 800b in FIG. 8B, the method may include heating the metallization layer 104 to activate a segregation of the alloying element 104a from the host material 104h. In FIG. 8A a comparison of the spatially distributed concentration 402 of the alloying element 104a is illustrated for various heating times at 220° C., indicating a layer formation velocity (thickness per time) of the self-organizing barrier layer 106 driven by the self-segregation.

The line 802 illustrates the spatially distributed concentration 402 of the alloying element 104a before heating. The line 806 illustrates the spatially distributed concentration 402 of the alloying element 104a after heating for various times in the range from about 15 minutes to about 45 minutes. As visible, no significant change is noticeable between the various heating times, indicating that the full equilibrium reached by less than about 15 minutes.

As visible in the comparison with 500a and 500b, the layer formation velocity of the self-organizing barrier layer 106 is greater than a layer formation velocity of the reaction product from the semiconductor material 412 and the host material 104h.

Further, the self-organizing barrier layer 106 may be time-stable. A time stability of the self-organizing barrier layer 106 (at a certain temperature and/or at a certain heating time) may be greater than a time stability of the interface 110 between the metallization layer 104 (e.g. the host material 104h) and semiconductor region 102 (e.g. the semiconductor material 412).

According to various embodiments, the self-organizing barrier layer 106 may be time-stable for more than about 15 minutes (e.g. at 200° C. or 220° C.), e.g. for more than about 30 minutes (e.g. at 200° C. or 220° C.), e.g. for more than about 45 minutes (e.g. at 200° C. or 220° C.), e.g. for more than about 60 minutes (e.g. at 200° C. or 220° C.), e.g. for more than about 75 minutes (e.g. at 200° C. or 220° C.).

Figure 9A:
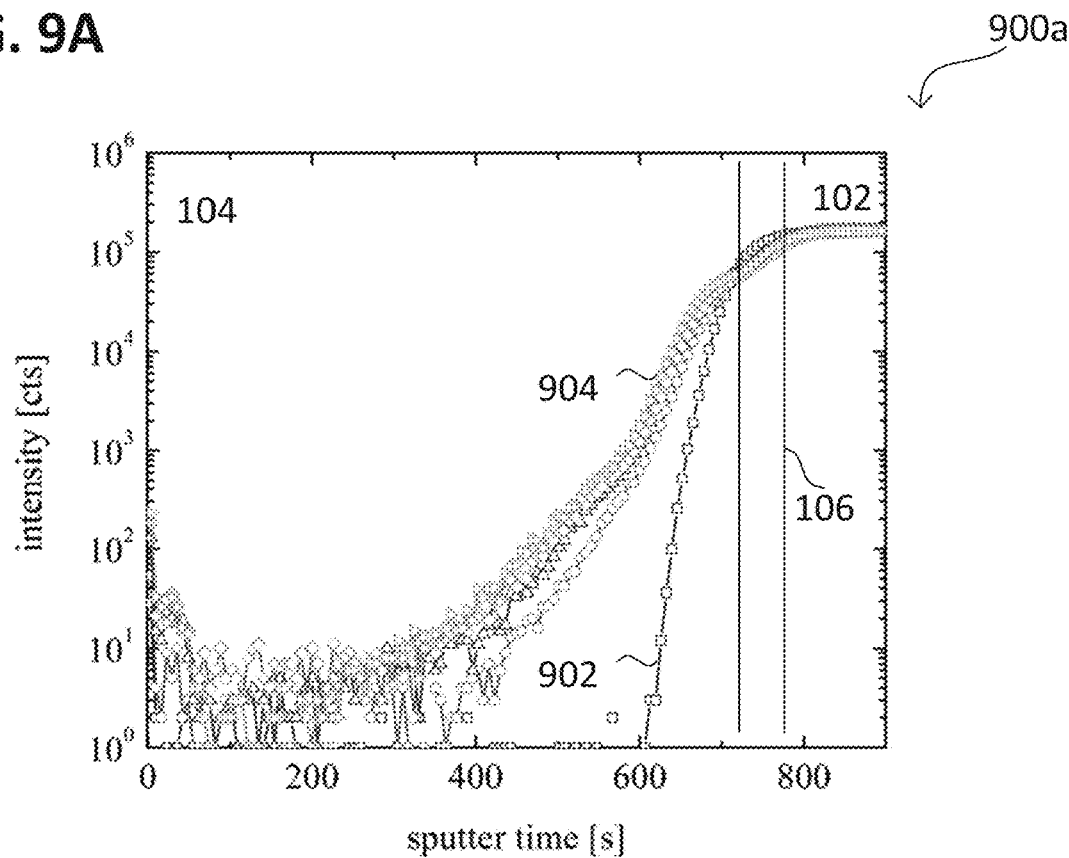
FIGS. 9A and 9B respectively show a schematic diagram.
Figure 9B:
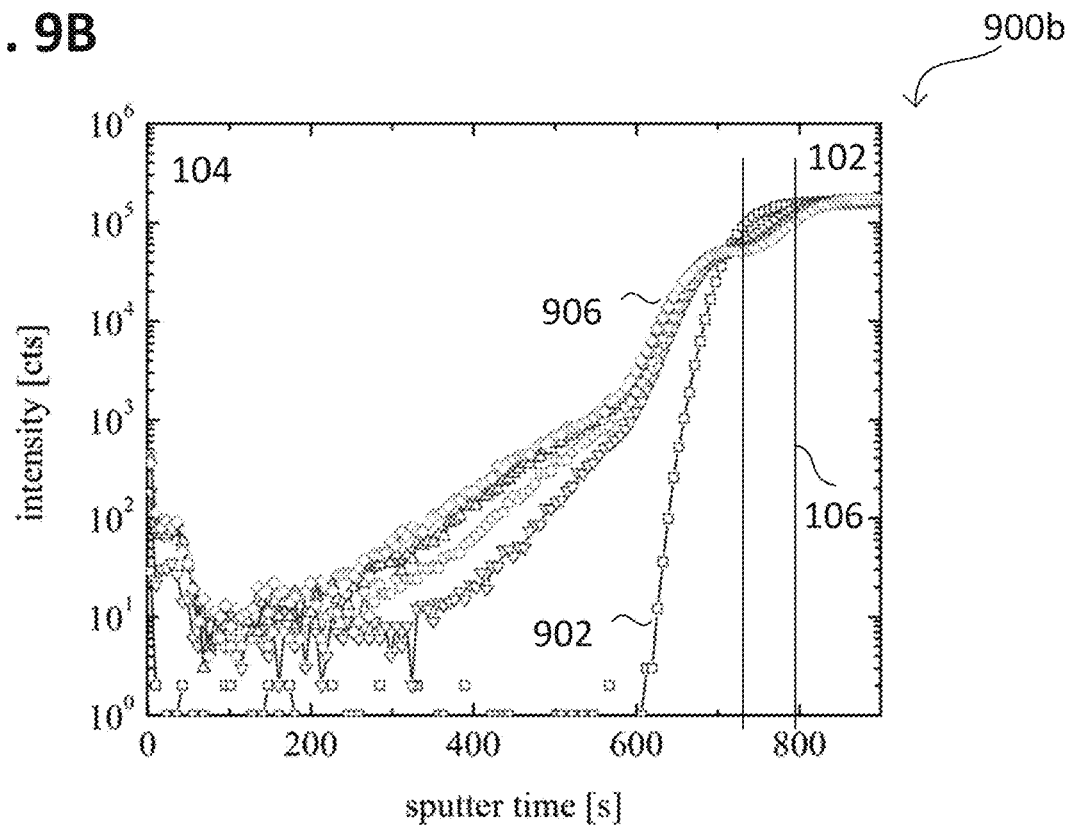

FIG. 9A and FIG. 9B respectively show a schematic diagram, similar to FIG. 4A and FIG. 4B.

As shown in a diagram 900a in FIG. 9A, the method may include heating the metallization layer 104 to activate a segregation of the alloying element 104a from the host material 104h. In FIG. 9A a comparison of the spatially distributed concentration 402 of the semiconductor material 412 is illustrated for various heating times at 200° C., indicating a diffusion velocity (length per time) of the semiconductor material 412 106 driven by temperature activated diffusion.

The line 902 illustrates the spatially distributed concentration 402 of the semiconductor material 412 before heating. The line 904 illustrates the spatially distributed concentration 402 of the semiconductor material 412 after heating at 200° C. for various times in the range from about 30 minutes to about 75 minutes. As visible, a slight diffusion of the semiconductor material 412 into the metallization layer 104 occurs, but no significant increase of the diffusion length is noticeable with increasing heating time, indicating that the full equilibrium reached by a maximum of 30 minutes.

As shown in a diagram 900b in FIG. 9B, the method may include heating the metallization layer 104 to activate a segregation of the alloying element 104a from the host material 104h. In FIG. 9B a comparison of the spatially distributed concentration 402 of the semiconductor material 412 is illustrated for various heating times at 220° C., indicating a diffusion velocity (length per time) of the semiconductor material 412 106 driven by temperature activated diffusion.

The line 902 illustrates the spatially distributed concentration 402 of the semiconductor material 412 before heating. The line 906 illustrates the spatially distributed concentration 402 of the semiconductor material 412 after heating at 220° C. for various times in the range from about 15 minutes to about 45 minutes. As shown, a slight diffusion of the semiconductor material 412 into the metallization layer 104 occurs, but no significant increase of the diffusion length is noticeable with increasing heating time, indicating that the full equilibrium reached by a maximum of 15 minutes.

As shown in comparison with 800a and 800b, the diffusion velocity of the semiconductor material 412 (e.g. at least one of into the metallization layer 104 or out of the semiconductor region 102) may be less than the diffusion velocity of the alloying element 104a (e.g. at least one of out of the metallization layer 104 or into the semiconductor region 102). Alternatively or additionally, the diffusion velocity of the host material 104h (e.g. at least one of out of the metallization layer 104 or into the semiconductor region 102) may be less than the diffusion velocity of the alloying element 104a (e.g. at least one of out of the metallization layer 104 or into the semiconductor region 102).

Figure 10A:
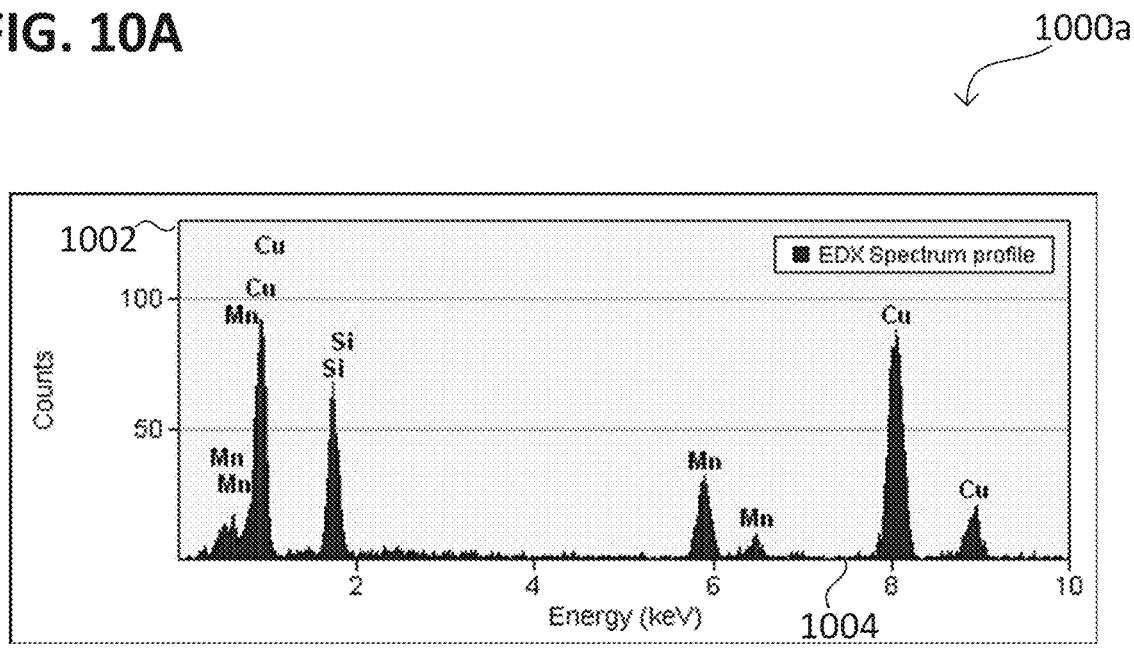
FIGS. 10A and 10B respectively show a schematic diagram.
Figure 10B:
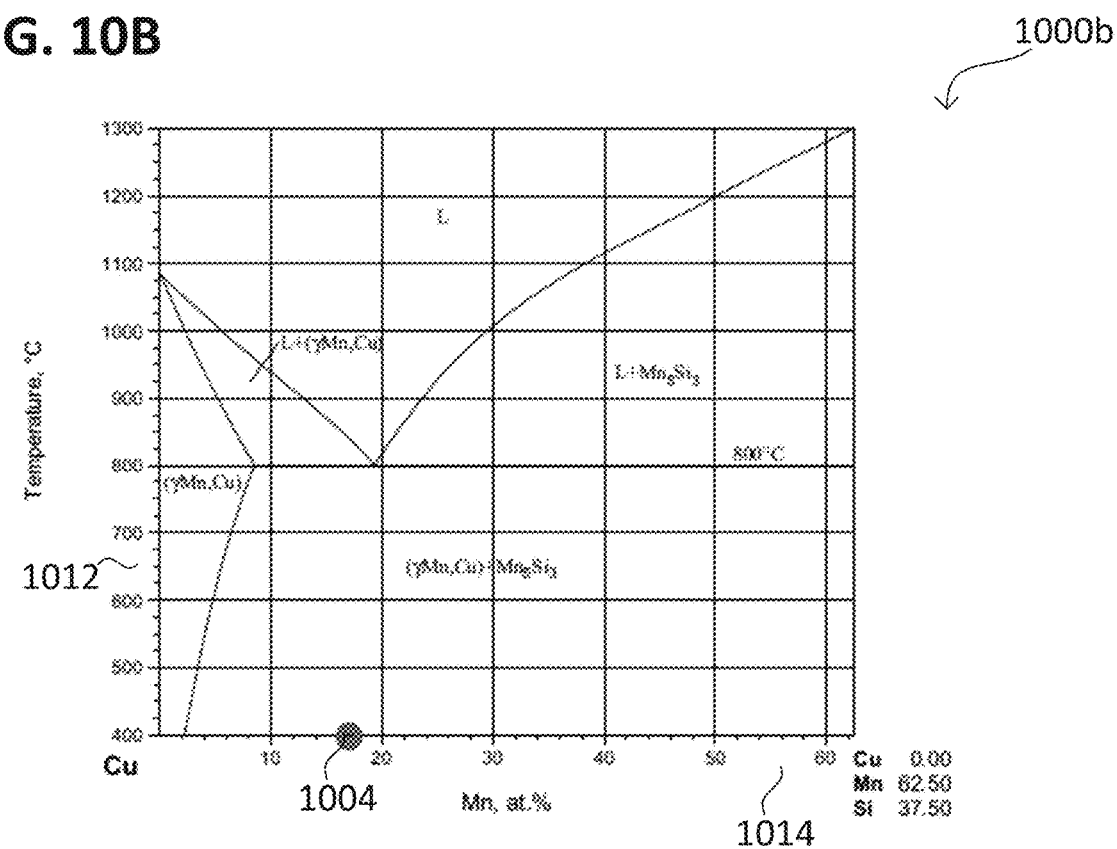

FIG. 10A and FIG. 10B respectively show a schematic diagram. Diagram 1000a shows a chemical analysis (e.g. energy-dispersive X-ray spectroscopy) obtained from the interface between the self-organizing barrier layer 106 and the metallization layer 104 in the case of a manganese barrier layer 106, a silicon semiconductor material 412 and a copper metallization layer 104. The diagram 1000a illustrates an intensity parameter 1002 representing a concentration and an energy parameter 1004 representing a specific chemical element. Strong peaks indicate the presence of copper (Cu), manganese (Mn) and silicon (Si).

FIG. 10B shows a phase diagram 1000b in dependency of temperature 1012 and a concentration of 1014 manganese in copper.

From this analysis the chemical composition 1004 proximate the self-organizing barrier layer 106 may be estimated to be about 62.5 at. % manganese and 37.5 at. % silicon, which may indicate the formation of a manganese silicide compound ($Mn_5Si_3$) and a gamma-phase of manganese-copper, see diagram 1000b.

Figure 11:
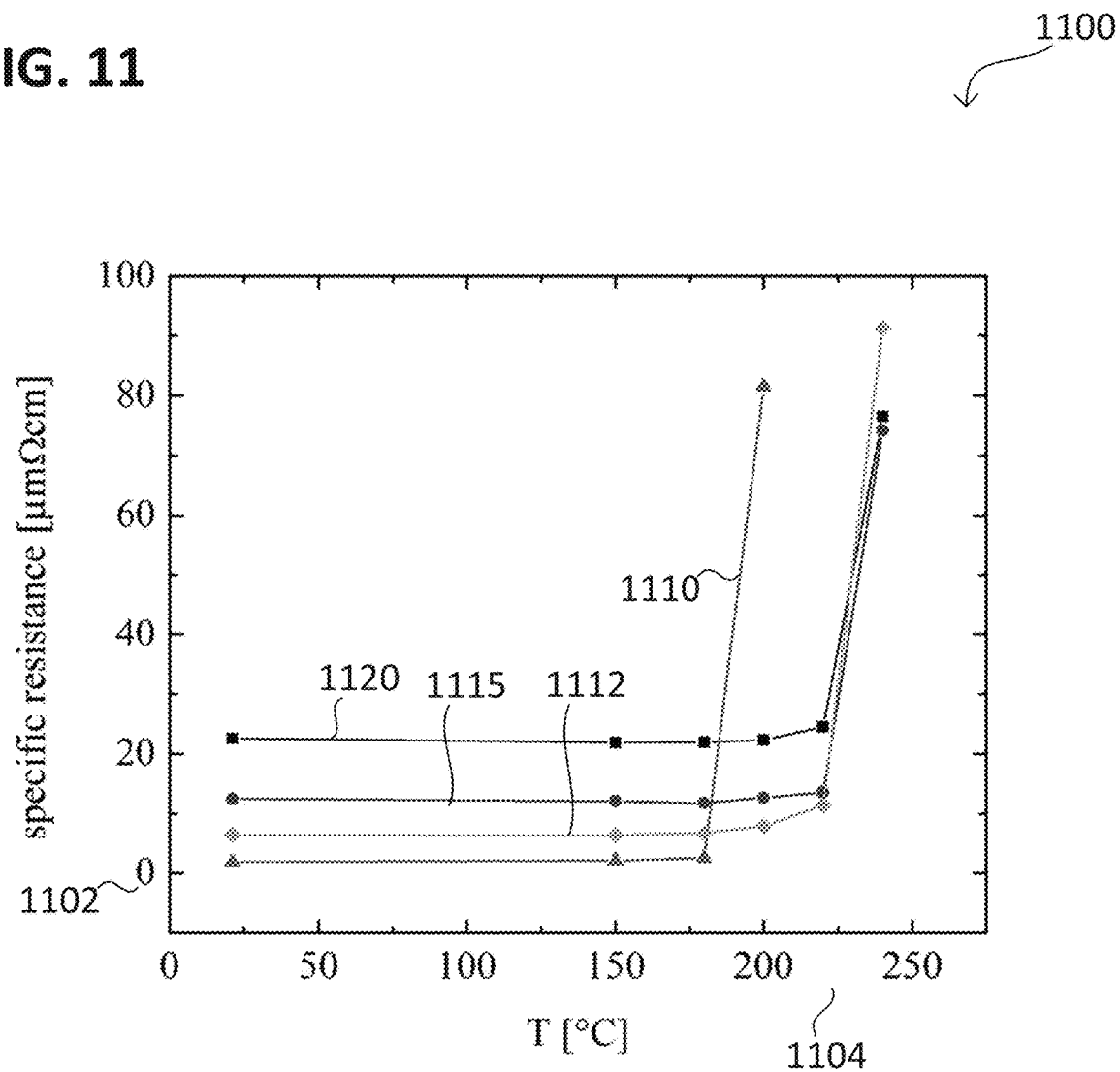
FIG. 11 shows a schematic diagram.

FIG. 11 shows a diagram 1100 illustrating a specific resistance 1102 (in µOhm·cm) in dependency of the temperature 1104 to which the metallization layer 104 is heated. An increase of the specific resistivity 1102 may indicate a reaction, e.g. between the semiconductor material 412 and at least one of the host material 104h or the alloying element 104a, e.g. a formation of a binary metallic compound, e.g. a silicide formation, and therefore may indicate the reaction temperature.

Line 1110 represents a first concentration (before the activating the segregation), in other words, a concentration (e.g. spatially averaged) of the alloying element 104a in the metallization layer 104, of less than 0.5 at: %, e.g. about 0 at: %, line 1112 represents a first concentration of about 2 at: %, line 1115 represents a first concentration of about 5 at: %, and line 1120 represents a first concentration of about 10 at: %.

As shown by line 1110, the reaction temperature may be about 180° C. As by lines 1112, 1115, 1120 a first concentration greater than about 0.5 at: % may suppress the reaction between the host material 104h and the semiconductor material 412 up to a temperature greater than about 225° C.

A specific resistance 1102 between the metallization layer 104 and the semiconductor region 102 may be less than about 70 µOhm·cm, e.g. less than about 60 µOhm·cm, e.g. less than about 50 µOhm·cm, e.g. less than about 40 µOhm·cm, e.g. less than about 30 µOhm·cm, e.g. at least one of during or after activating the segregation and/or at least one of during or after heating the metallization layer 104 to a temperature greater than about 200° C., e.g. greater than about 220° C.

A specific resistance 1102 between the metallization layer 104 and the semiconductor region 102 may be substantially constant (variate less than 30%) during the activating of the segregation. Alternatively or additionally, the specific resistance 1102 between the metallization layer 104 and the semiconductor region 102 may be substantially constant up to a minimum temperature of about 200° C., e.g. a minimum temperature of about 220° C.

A temperature activating a reaction of the semiconductor material 412 with the host material 104h may be less than a temperature activating a reaction of the semiconductor material 412 with the alloying element 104a. Alternatively or additionally, a temperature activating a reaction of the semiconductor material 412 with the host material 104h may be increased by the self-organizing barrier layer 106, e.g. by a minimum of 20° C., e.g. by a range from about 40° C. to about 60° C.

Figure 12:
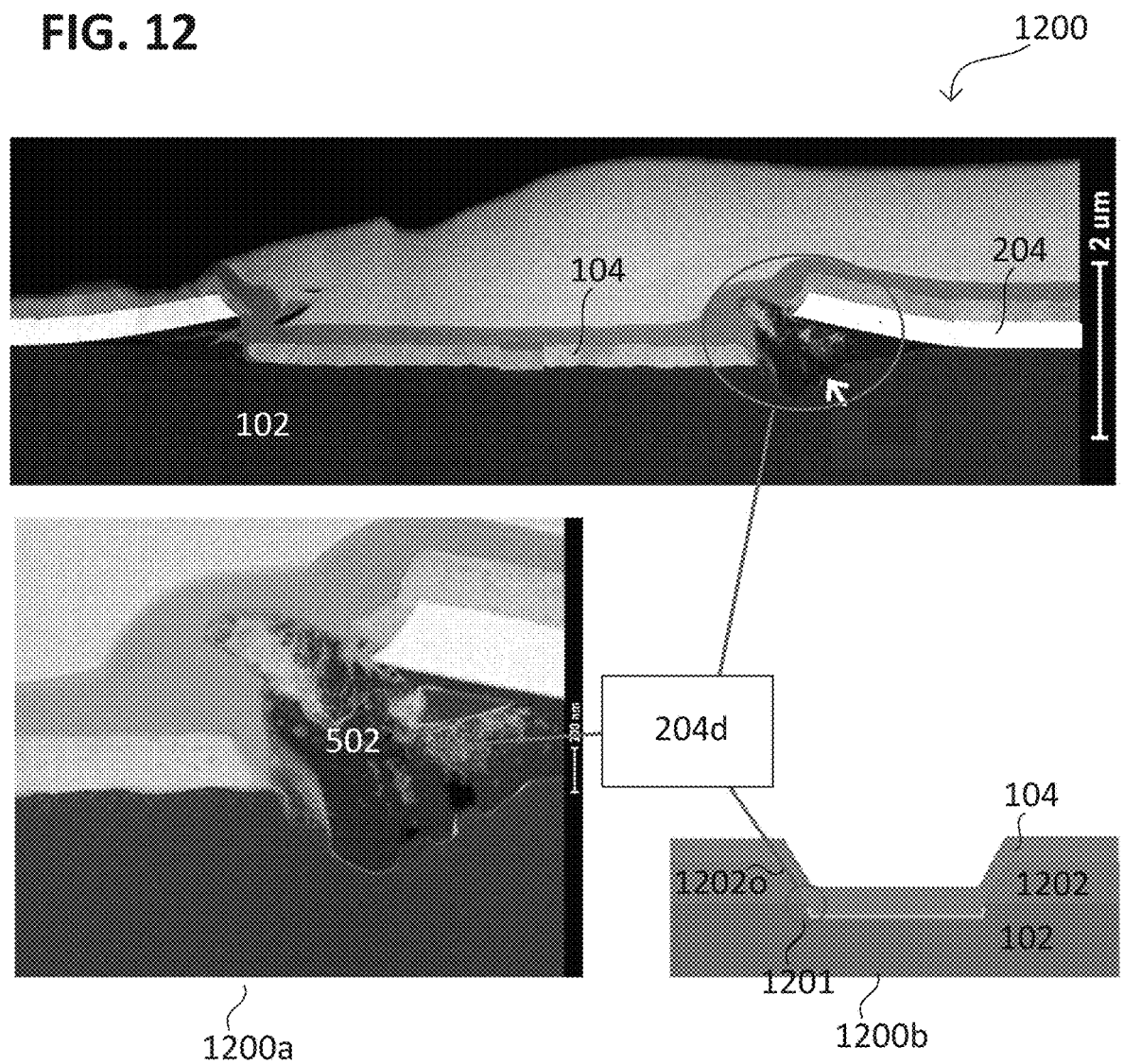
FIG. 12 shows a semiconductor device according to various embodiments, in a method according to various embodiments in a schematic cross sectional view or side view.

FIG. 12 shows a semiconductor device 1200 according to various embodiments, in a method according to various embodiments in a schematic cross sectional view or side view in the triple point 1201, in which the at least one further barrier layer 204, the semiconductor region 102 and the metallization layer 104 contact each other, wherein view 1200a gives a detailed view and view 1200b gives an overview.

The semiconductor device may include an intermediate oxide layer 1202 between the metallization layer 104 and the semiconductor region 102. The intermediate oxide layer 1202 may include an opening 1202o in which the metallization layer 104 is extended.

If the segregation is not activated, a defect 204d may lead to damage of the semiconductor device 1300. The at least one further barrier layer 204 may include a defect 204d in which a reaction compound 502 may be formed from the host material 104h and the semiconductor material 412 which propagates between the at least one further barrier layer 204 and the semiconductor region 102 inducing further damage.

Figure 13:
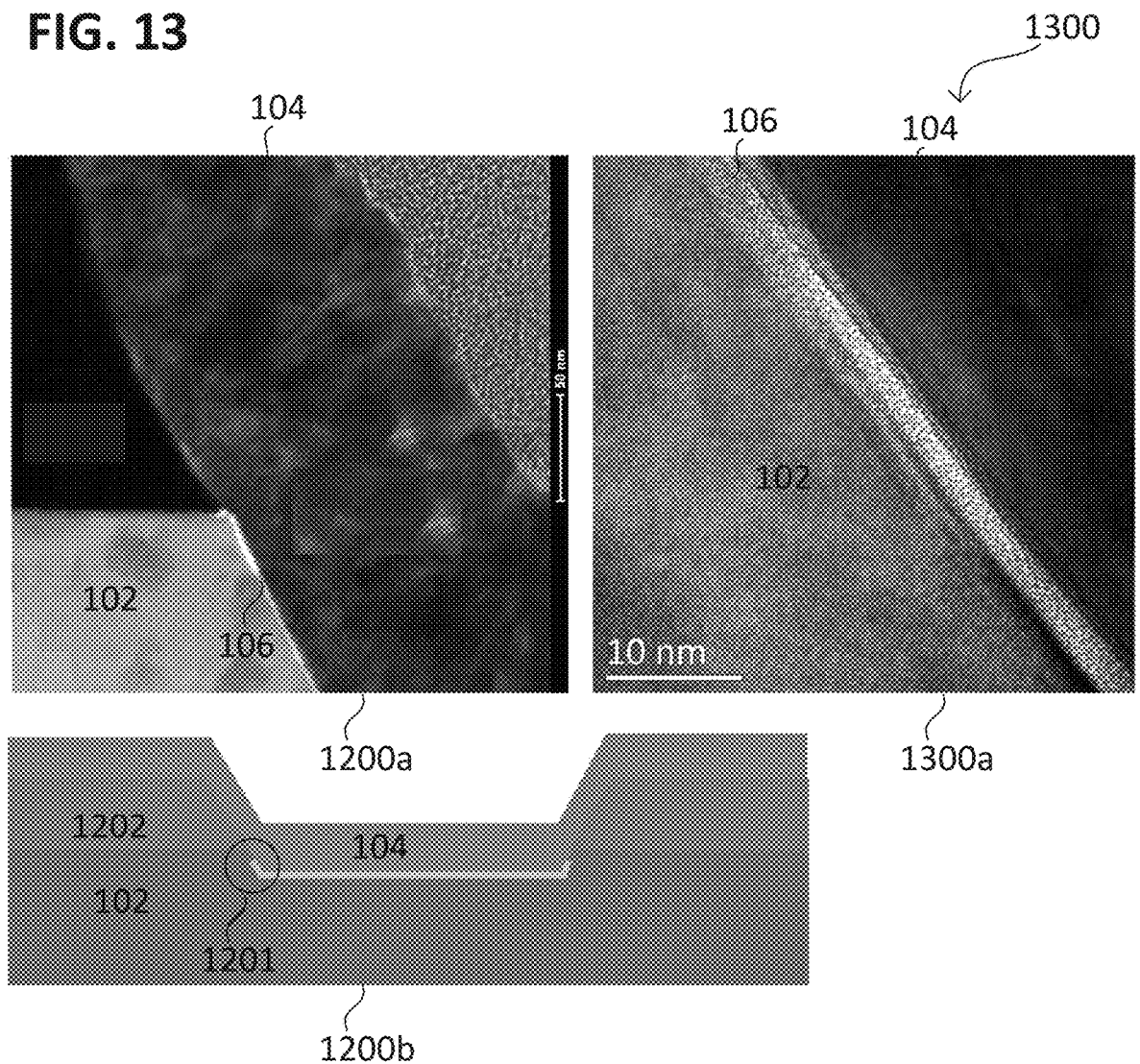
FIG. 13 shows a semiconductor device according to various embodiments, in a method according to various embodiments in a schematic cross sectional view or side view.

FIG. 13 illustrates a semiconductor device 1300 according to various embodiments, in a method according to various embodiments in a schematic cross sectional view or side view, wherein view 1200a gives a detailed view, 1300a gives a microstructural view, and view 1200b gives an overview.

If the segregation is activated, the self-organizing barrier layer 106 may be formed between the metallization layer 104 and the semiconductor region 102 suppressing further damage of the semiconductor device 1300.

Figure 14:
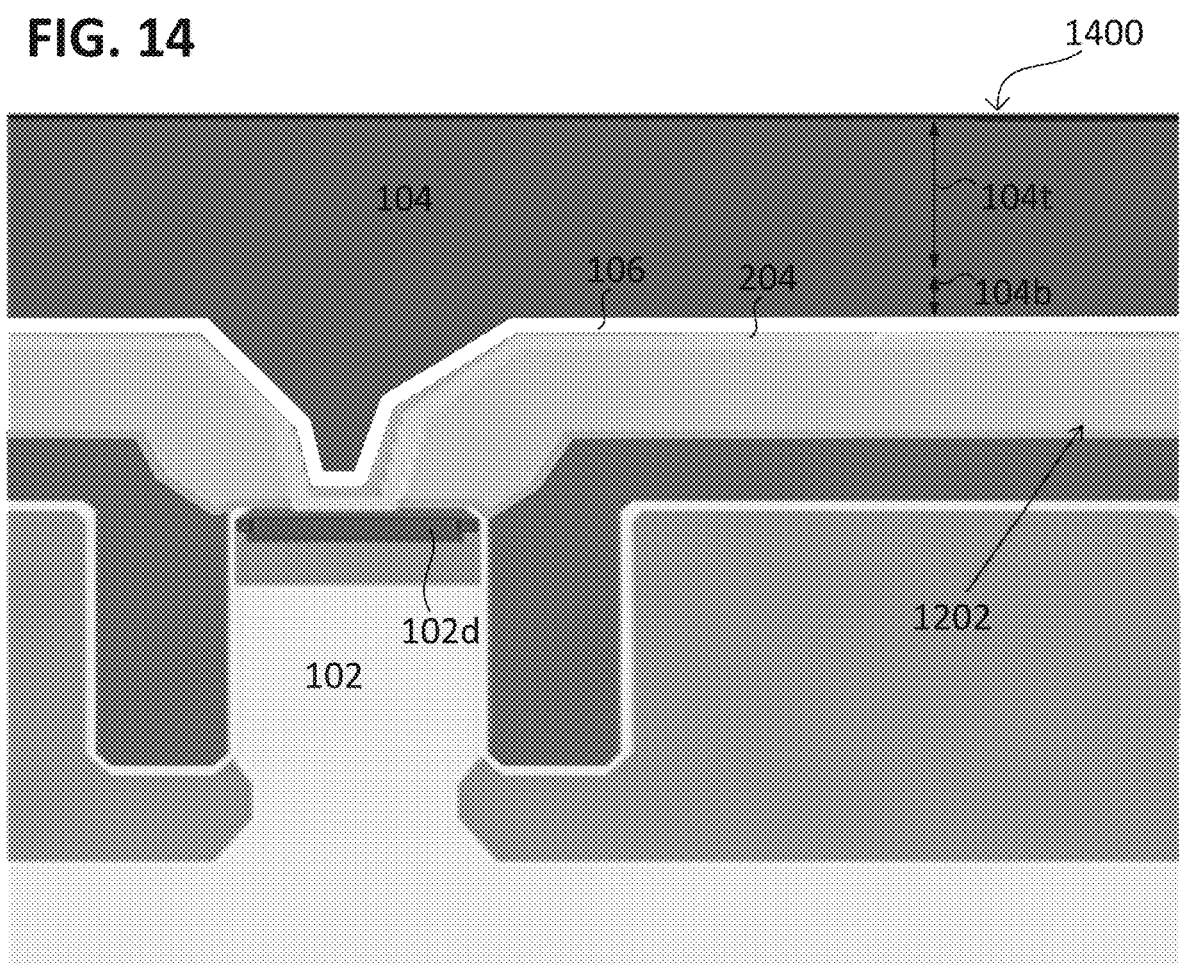
FIG. 14 shows a semiconductor device according to various embodiments, in a method according to various embodiments in a schematic cross sectional view or side view.

FIG. 14 shows a semiconductor device 1400 according to various embodiments, in a method according to various embodiments in a schematic cross sectional view or side view.

The semiconductor region 102 may include a doped region 102d (doped semiconductor region 102d) proximate the metallization layer 104.

The self-organizing barrier layer 106 may also extend between the intermediate oxide layer 1202 and the metallization layer 104.

The metallization layer 104 may include a first sublayer 104b including or formed from the self-segregating composition and a second sublayer 104t including or formed from the host material 104h. Illustratively, the first sublayer 104b may serve as seed layer.

Figure 15:
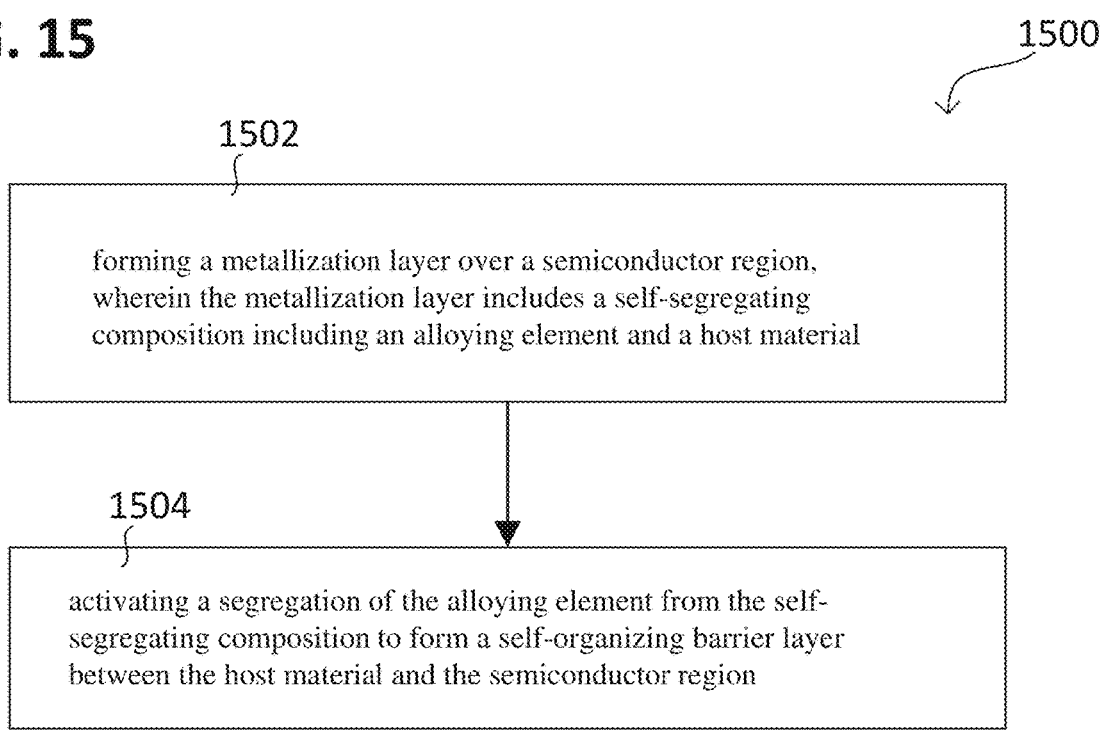
FIG. 15 shows a method according to various embodiments in a schematic flow diagram.

FIG. 15 illustrates a method 1500 according to various embodiments in a schematic flow diagram.

The method may include, in 1502, forming a metallization layer over a semiconductor region, wherein the metallization layer may include or be formed from a self-segregating composition, which may include or be formed from an alloying element and a host material. The method may further include, in 1504, activating a segregation of the alloying element from the self-segregating composition to form a self-organizing barrier layer between the host material and the semiconductor region.

FIG. 16 illustrates a method 1600 according to various embodiments in a schematic flow diagram.

The method may include, in 1602, forming a metallization layer over a barrier layer, wherein the metallization layer may include or be formed from an alloying element configured to be self-segregating from the metallization layer. The method may further include, in 1604, healing (in other words, sealing) a defect in the barrier layer by segregating the alloying element from the metallization layer at least one of in or over the defect.

Figure 17A:
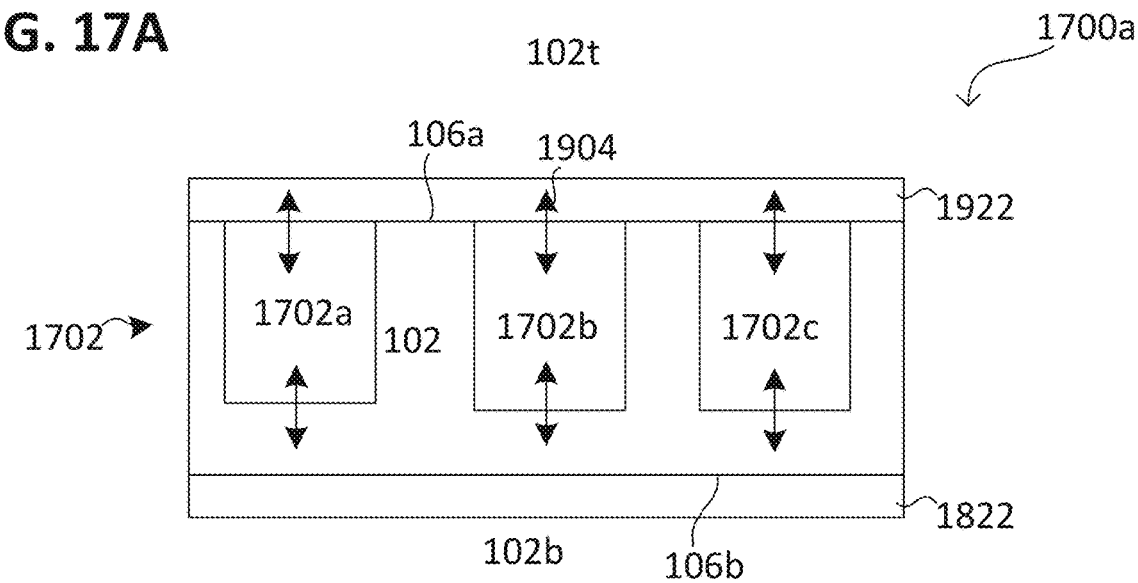
FIGS. 17A and 17B respectively show a semiconductor device according to various embodiments, in a method according to various embodiments in a schematic cross sectional view or side view.

FIG. 17A illustrates a semiconductor device 1700a according to various embodiments in a method according to various embodiments in a schematic cross sectional view or side view.

According to various embodiments, the semiconductor device 1700a may include a plurality of semiconductor circuit elements 1702a, 1702b, 1702c electrically connected 1904 in parallel to each other.

The semiconductor device 1900a may include a first metallization layer 1922 on the first side 102t of the semiconductor region 102. Each semiconductor circuit element of the plurality of semiconductor circuit elements 1702a, 1702b, 1702c may be electrically connected 1904 to the first metallization layer 1922. Alternatively or additionally, the semiconductor device 1900a may include a second metallization layer 1822 on the second side 102b of the semiconductor region 102. Each semiconductor circuit element of the plurality of semiconductor circuit elements 1702a,

1702b, 1702c may be electrically connected 1904 to the second metallization layer 1822.

According to various embodiments, each semiconductor circuit element of the plurality of semiconductor circuit elements 1702a, 1702b, 1702c may include or be formed from a diode structure or a transistor structure (also referred to as transistor cell). According to various embodiments, the plurality of semiconductor circuit elements 1702a, 1702b, 1702c may be part of or form a power semiconductor circuit element 1702.

According to various embodiments, each semiconductor circuit element of the plurality of semiconductor circuit elements 1702a, 1702b, 1702c (e.g. the power semiconductor circuit element 1702) may include or be formed from a vertical structure. A vertical structure may be understood as providing a current flow from the first side of the semiconductor region 102 to the second side 102b of the semiconductor region 102 or vice versa.

According to various embodiments, each semiconductor circuit element of the plurality of semiconductor circuit elements 1702a, 1702b, 1702c (e.g. the power semiconductor circuit element 1702) may include at least one gate contact pad. The at least one gate contact pad may be provided by (e.g. formed from) the first metallization 1922.

According to various embodiments, a first self-organizing barrier layer 106a may be formed between the first metallization layer 1922 and the semiconductor region 102. Alternatively or additionally, a second self-organizing barrier layer 106b may be formed between the second metallization layer 1822 and the semiconductor region 102.

Figure 17B:
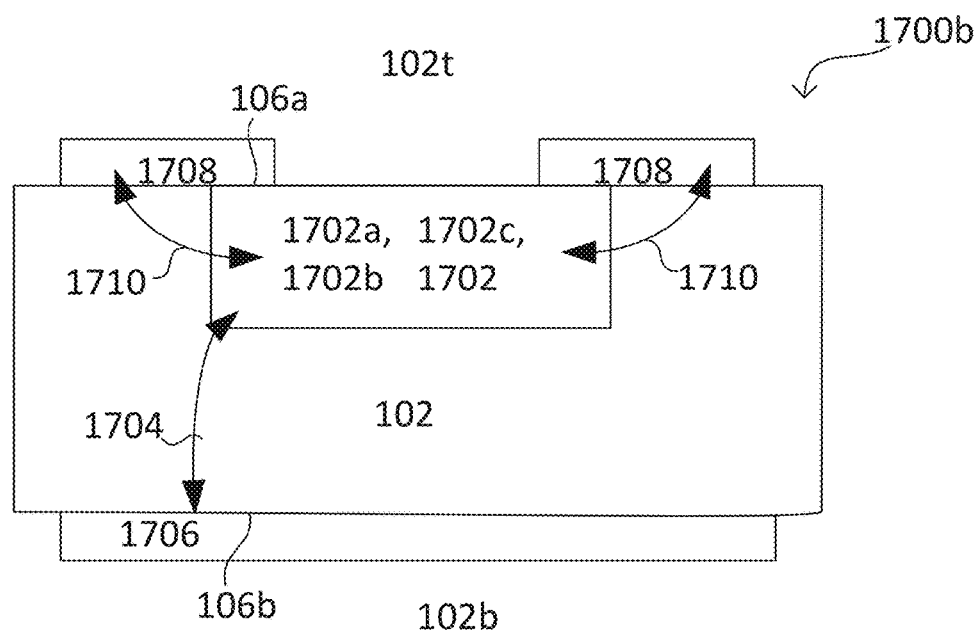

FIG. 17B illustrates a semiconductor device 1700b according to various embodiments in a method according to various embodiments in a schematic cross sectional view or side view.

The semiconductor device 1700b may include at least one a semiconductor circuit element 1702a, 1702b, 1702c, e.g. a power semiconductor circuit element 1702, formed at least one of over or in the semiconductor region.

According to various embodiments, the semiconductor device 1700a may include at least one first contact pad 1706 (e.g. at least one collector contact pad 1706). The at least one first contact pad 1706 may be electrically connected to the at least one semiconductor circuit element 1702a, 1702b, 1702c, 1702. The at least one first contact pad 1706 may be formed by structuring the second metallization layer 1822.

Alternatively or additionally, the semiconductor device 1700a may include at least one second contact pad 1708 (e.g. a source/drain contact pad 1706) formed in electrical contact 1710 to the at least one semiconductor circuit element 1702a, 1702b, 1702c, 1702. The at least one second contact pad 1708 optionally may include a gate contact pad, e.g. which may be formed electrically insulated from the semiconductor region 102. The at least one second contact pad 1708 may be formed by structuring the first metallization layer 1922.

According to various embodiments, the semiconductor circuit element 1702a, 1702b, 1702c, 1702 may include or be formed from insulated-gate bipolar transistor.

According to various embodiments, a first self-organizing barrier layer 106a may be formed between the at least one second contact pad 1708 and the semiconductor region 102. Alternatively or additionally, a second self-organizing barrier layer 106b may be formed between the at least one first contact pad 1706 and the semiconductor region 102.

Figure 18A:
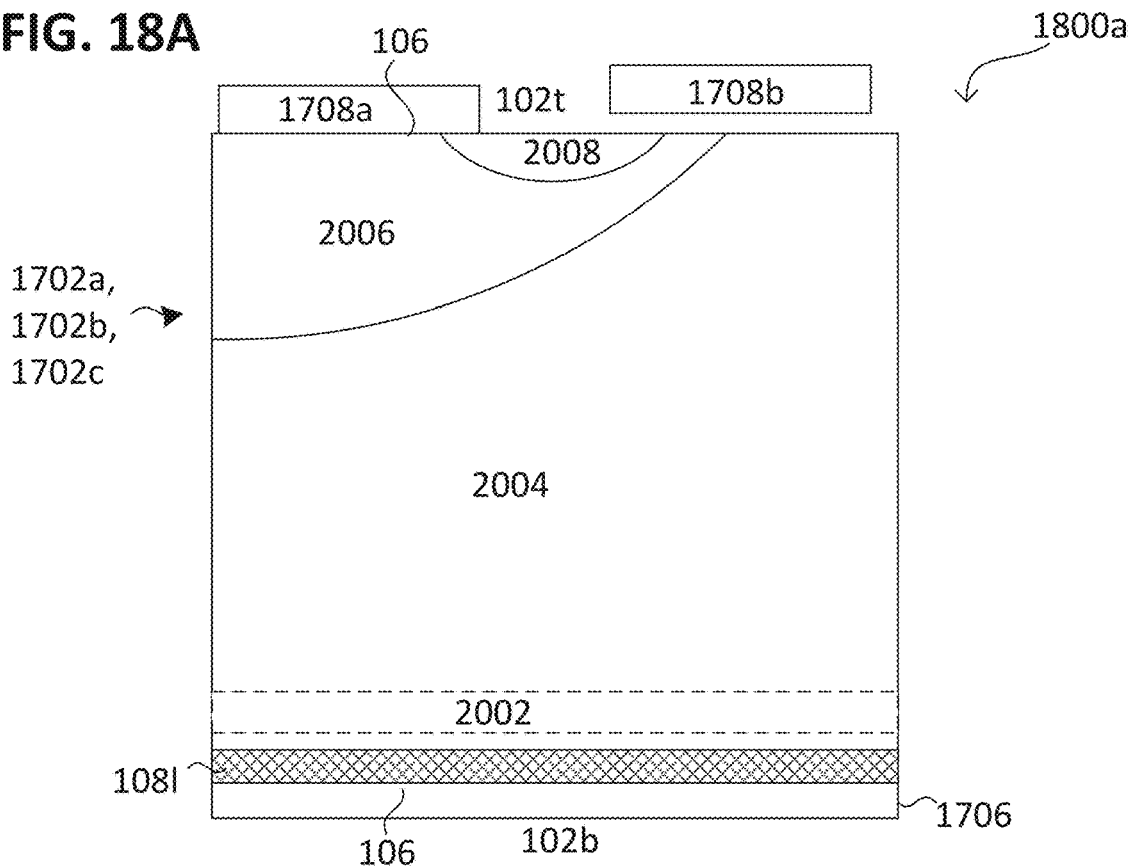
FIGS. 18A and 18B respectively show a semiconductor device according to various embodiments, in a method according to various embodiments in a schematic cross sectional view or side view.

FIG. 18A illustrates a semiconductor device 1800a according to various embodiments in a method according to various embodiments in a schematic cross sectional view or side view, e.g. a semiconductor circuit element 1702a, 1702b, 1702c, e.g. a power semiconductor circuit element 1702.

The semiconductor device 1800a may include a doped semiconductor region 1081 (doped collector region 1081) formed on a second side 102b of the substrate. The doped collector region 1081 may include or be formed from a first doping type.

The semiconductor device 1800a may further include a first contact pad 1706 in form of a collector contact pad 1706 (e.g. a drain contact pad). The first contact pad 1706 may electrical contact the doped collector region 1081. The first contact pad 1706 may include or be formed from a metallization layer.

Further, the semiconductor device 1800a may include a first doped region 2006 (doped first semiconductor region 2006). The first doped region 2006 may include or be formed from a base region. The first doped region 2006 may include (e.g. a dopant having) a doping type equal to the doped collector region 1081 (in other words, the dopant of the doped collector region 1081), e.g. the first doping type. The semiconductor device 1800a may further include a second contact pad 1708a electrical contacting the first doped region 2006. The second contact pad 1708a may include or be formed from an emitter contact pad 1708a (e.g. a source contact pad 1708a). The second contact pad 1708a may include or be formed from a metallization layer.

Further, the semiconductor device 1800a may include a second doped region 2004 (doped second semiconductor region 2004) formed between the first doped region 2006 and the doped collector region 1081. The second doped region 2004 may include or be formed from a drift region. The second doped region 2004 may include a doping type (second doping type) different from the doped collector region 1081, e.g. a dopant having the second doping type. The second doped region 2004 may include an epitaxially formed layer.

The semiconductor device 1800a may further include a further second contact pad 1708b. The further second contact pad 1708b may include or be formed from a gate contact pad 1708b. The further second contact pad 1708b may be formed electrical insulated from the second doped region 2004, e.g. by an electrically insulating layer formed between the further second contact pad 1708b and the second doped region 2004. The further second contact pad 1708b may include or be formed from a metallization layer.

Further, the semiconductor device 1800a may include a third doped region 2008 (doped third semiconductor region 2008). The third doped region 2008 may include or be formed from an emitter region. The third doped region 2008 may include (e.g. a dopant having) a doping type different from the doped collector region 1081, e.g. the second doping type. A dopant concentration of the third doped region 2008 may be greater than of the second doped region 2004.

Optionally, the semiconductor device 1800a may include a fourth doped region 2002 (doped fourth semiconductor region 2002) between the second doped region 2004 and the doped collector region 1081. The fourth doped region 2002 may include or be formed from a field stop region. The fourth doped region 2002 may include a dopant having a doping type different from the doped collector region 1081. The fourth doped region 2002 may include a dopant concentration higher than the second doped region 2004.

According to various embodiments, the first doping type may be an n-doping type and the second doping type may be a p-doping type. Alternatively, the first doping type may be the p-doping type and the second doping type may be the n-doping type.

The semiconductor device 1800a, e.g. a semiconductor circuit element 1702a, 1702b, 1702c may include or be formed from a transistor structure, e.g. a planar transistor structure (providing a vertical current flow). A transistor structure may include or be formed from a plurality of p-n junctions (e.g. more than one). A p-n junction may be formed by an interface of two doped regions having different doping types, e.g. an interface between at least one the following: the first doped region 2006 and the second doped region 2004; the first doped region 2006 and the third doped region 2008; the second doped region 2004 and the doped collector region 1081; the second doped region 2004 and the fourth doped region 2002 (if present).

According to various embodiments, the semiconductor device 1800a, e.g. a semiconductor circuit element, may include or be formed from an insulated-gate bipolar transistor.

Figure 18B:
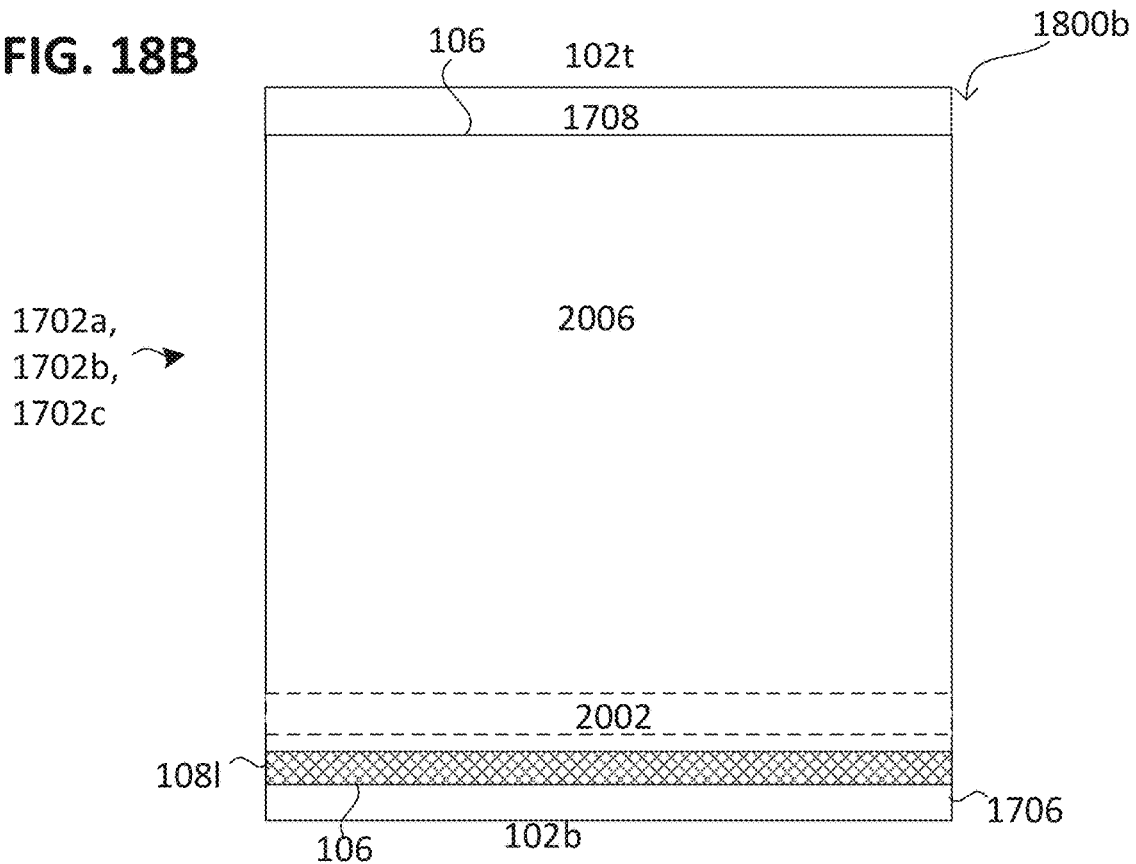

FIG. 18B illustrates a semiconductor device 1800b according to various embodiments in a method according to various embodiments in a schematic cross sectional view or side view, e.g. a semiconductor circuit element 1702a, 1702b, 1702c.

The semiconductor device 1800b may include the doped collector region 1081 formed on the second side 102b. The doped collector region 1081 may include or be formed from a first doping type. The doped collector region 1081 may include or be formed from a first junction region.

The semiconductor device 1800b may further include a first contact pad 1706 electrical contacting the doped collector region 1081. The first contact pad 1706 may include or be formed from an electrode contact pad. The first contact pad 1706 may include or be formed from a metallization layer.

Further, the semiconductor device 1800b may include a first doped region 2006. The first doped region 2006 may include or be formed from a second junction region. The first doped region 2006 may include a dopant having a doping type different from the doped collector region 1081 (in other words, the dopant of the doped collector region 1081), e.g. the second doping type. The semiconductor device 1800b may further include a second contact pad 1708 electrical contacting the first doped region 2006. The second contact pad 1708 may include or be formed from an electrode contact pad. The second contact pad 1708a may include or be formed from a metallization layer.

Optionally, the semiconductor device 1800b may include a second doped region 2002 between the first doped region 2006 and the doped collector region 1081. The second doped region 2002 may include or be formed from a field stop region. The second doped region 2002 may include (e.g. a dopant having) a doping type equal to the doped collector region 1081. The second doped region 2002 may include a dopant concentration higher than the first doped region 2006.

The semiconductor device 1800b, e.g. a semiconductor circuit element 1702b, 1702b, 1702b, e.g. a power semiconductor circuit element 1702, may include or be formed from a diode structure, e.g. a planar diode structure (providing a vertical current flow). A diode structure may include or be formed from one p-n junction, e.g. formed by an interface of two doped regions having different doping types, e.g. an interface between the first doped region 2006 and the doped collector region 1081 or an interface between the second doped region 2002 (if present) and the first doped region 2006.

Optionally, the doped collector region 1081 may include or be formed from a plurality of first segments including the first doping type and a plurality of second segments including the second doping type. The segments of the plurality of first segments and the segments of the plurality of second segments may be disposed in an alternating order. In this case, the doped collector region 1081 may be part of backward-diode structure.

The metallization layer may include or be formed from a power metallization.

Further, various embodiments will be described in the following.

According to various embodiments, a semiconductor device may include: a semiconductor region; a metallization layer disposed over the semiconductor region; and a self-organizing barrier layer disposed between the metallization layer and the semiconductor region, wherein the self-organizing barrier layer may include or be formed from a first metal configured to be self-segregating from the metallization layer.

According to various embodiments, a semiconductor device may include: a semiconductor region; a metallization layer disposed over the semiconductor region; and a self-organizing barrier layer disposed between the metallization layer and the semiconductor region, wherein the self-organizing barrier layer may include or be formed from an alloying element (e.g. a first metal) configured to be self-segregating from the metallization layer.

According to various embodiments, the self-organizing barrier layer may be in physical contact to at least one of the metallization layer or the semiconductor region.

According to various embodiments, a temperature activating a segregation of the alloying element (e.g. the first metal) from the metallization layer may be less than a temperature activating a reaction of the semiconductor region with the metallization layer.

According to various embodiments, a temperature activating a segregation of the alloying element (e.g. the first metal) from the metallization layer (also referred to as segregation temperature) may be less than 180° C.

According to various embodiments, a concentration of the alloying element (e.g. the first metal) in the metallization layer may be in the range from about 0.5 at % to about 50 at %.

According to various embodiments, the self-organizing barrier layer may be substantially formed from at least one of the alloying element (e.g. the first metal) or a compound including or formed from the alloying element (e.g. the first metal) and a semiconductor of the semiconductor region.

According to various embodiments, a temperature activating a reaction of the semiconductor region with the alloying element (e.g. the first metal) may be greater than a temperature activating a reaction of the semiconductor region with the metallization layer (e.g. with the host material of the metallization layer).

According to various embodiments, an electronegativity of the alloying element may be less than an electronegativity of at least one of the host material or the semiconductor material According to various embodiments, the alloying element (e.g. the first metal) may be at least one of manganese, tantalum, chromium, tungsten, molybdenum.

According to various embodiments, a thickness of the metallization layer may be greater than ten times a thickness of the self-organizing barrier layer.

According to various embodiments, the metallization layer may include or be formed from a self-segregating composition including the alloying element (e.g. the first metal).

According to various embodiments, a concentration (e.g. atomic concentration) of the alloying element (e.g. the first metal) in the metallization layer may be less than at least one of a concentration of the host material (e.g. the second metal) in the metallization layer or a concentration of the alloying element (e.g. the first metal) in the self-organizing barrier layer.

According to various embodiments, the host material (e.g. the second metal) may be copper.

According to various embodiments, the metallization layer may be substantially free of a semiconductor of the semiconductor region.

According to various embodiments, the semiconductor region may be substantially free of a material of the metallization layer, e.g. at least one of: the host material or the alloying element.

According to various embodiments, an interface of the self-organizing barrier layer and the semiconductor region may be free of the host material (e.g. the second metal).

According to various embodiments, a specific resistance of at least one of the metallization layer or the self-organizing barrier layer may be less than 70 µOhm·cm (micro-ohm centimeter).

According to various embodiments, a specific resistance between the metallization layer and the semiconductor region may be less than 70 µOhm·cm.

According to various embodiments, a temperature stability of the self-organizing barrier layer is greater than a temperature activating a reaction of the host material with the semiconductor region (e.g. the semiconductor material), e.g. by more than about 10° C., e.g. by more than about 20° C., e.g. by more than about 30° C., e.g. by more than about 40° C., e.g. by more than about 50° C.

According to various embodiments, a temperature activating a segregation of the alloying element from the metallization layer (e.g. the host material) may be less than a temperature activating a reaction of the host material with the semiconductor region (e.g. the semiconductor material), e.g. by more than about 10° C., e.g. by more than about 20° C., e.g. by more than about 30° C., e.g. by more than about 40° C., e.g. by more than about 50° C.

According to various embodiments, the alloying element (e.g. the first metal) may be configured to segregate from the metallization layer faster than the metallization layer chemically reacts with the semiconductor region.

According to various embodiments, the metallization layer may include or be formed from a power metallization.

According to various embodiments, the semiconductor device may further include: a contact pad formed at least one of in or over the metallization layer.

According to various embodiments, the metallization layer may include or be formed from a first sublayer and a second sublayer, wherein the first sublayer is disposed between the second sublayer and the self-organizing barrier layer, wherein the first sublayer and the second sublayer include at least the host material and differ from each other in at least one of a chemical composition, a thickness.

According to various embodiments, the first sublayer includes the self-segregating compound.

According to various embodiments, the semiconductor device may further include: an electronic power semiconductor element formed at least one of in or over the semiconductor region, wherein the electronic power semiconductor element is electrically coupled (e.g. electrically connected) with the metallization layer.

According to various embodiments, the semiconductor device may further include: at least one further barrier layer between the self-organizing barrier layer and the semiconductor region, wherein the further barrier layer may include one or more defects through which the self-organizing barrier layer contacts the semiconductor region.

According to various embodiments, the semiconductor device may further include: at least one further barrier layer formed between the self-organizing barrier layer and the semiconductor region, wherein the further barrier layer may include or be formed from at least one of titanium or tungsten.

According to various embodiments, a thickness of the self-organizing barrier layer may be in the range from about 1 nm to about 20 nm.

According to various embodiments, a thickness of the metallization layer may be in the range from about 100 nm to about 1 µm.

According to various embodiments, a method may include: forming a metallization layer over a semiconductor region, wherein the metallization layer may include or be formed from a self-segregating composition including a first metal and a second metal; activating a segregation of first metal from the self-segregating composition to form a self-organizing barrier layer between the second metal and the semiconductor region.

According to various embodiments, a method may include: forming a metallization layer over a semiconductor region, wherein the metallization layer may include or be formed from a self-segregating composition including an alloying element (e.g. the first metal) and a host material (e.g. the second metal); activating a segregation of the alloying element (e.g. the first metal) from the self-segregating composition to form a self-organizing barrier layer between the host material (e.g. the second metal) and the semiconductor region.

According to various embodiments, a concentration of the alloying element in the self-segregating composition is in the range from about 0.5 at % to about 50 at %.

According to various embodiments, activating the segregation of the alloying element (e.g. the first metal) from the metallization layer may include or be formed from heating the metallization layer, e.g. above a segregation temperature.

According to various embodiments, the method may further include: forming at least one further barrier layer between the metallization layer and the semiconductor region, wherein the further barrier layer may include or be formed from at least one of titanium or tungsten.

According to various embodiments, the self-organizing barrier layer is formed between the host material (e.g. the second metal) and at least one further barrier layer.

According to various embodiments, a concentration of the alloying element (e.g. the first metal) in the metallization layer may be less than a concentration of the host material (e.g. the second metal) in the metallization layer, e.g. at least one of before or after the activating the segregation.

According to various embodiments, a method may include: forming a metallization layer over a barrier layer (e.g. the at least one further barrier layer); wherein the metallization layer may include or be formed from a first metal configured to be self-segregating from the metallization layer; and healing a defect in the barrier layer by segregating the first metal from the metallization layer at least one of in or over the defect.

According to various embodiments, a method may include: forming a metallization layer over a barrier layer (e.g. the at least one further barrier layer); wherein the metallization layer may include or be formed from an alloying element (e.g. the first metal) configured to be self-segregating from the metallization layer; and healing a defect in the barrier layer by segregating the alloying element (e.g. the first metal) from the metallization layer at least one of in or over the defect.

According to various embodiments, the alloying element may be in physical contact with at least one of the metallization layer, the defect, the barrier layer.

According to various embodiments, the alloying element may extend into the defect.

According to various embodiments, the metallization layer may be heated to a temperature greater than a segregation temperature of the alloying element (e.g. the first metal) in the metallization layer.

According to various embodiments, forming the self-organizing barrier may include or be formed from changing a chemical composition of the metallization layer.

According to various embodiments, a chemical composition of the metallization layer is changed by segregating the alloying element (e.g. the first metal) from at least one of the metallization layer or self-segregating composition.

According to various embodiments, a concentration of the alloying element (e.g. the first metal) in at least one of the metallization layer or the self-segregating composition may be reduced by segregating the alloying element (e.g. the first metal) from the metallization layer.

According to various embodiments, at least one of the self-segregating composition, the host material, or the alloying element may be electrically conductive.

According to various embodiments, the self-segregating composition may include or be formed from a metal alloy, e.g. a self-segregating metal alloy, e.g. self-segregating binary metal alloy.

According to various embodiments, a chemical reactivity of the alloying element to the semiconductor material may be less than a chemical reactivity of the host material to the semiconductor material.

According to various embodiments, a specific resistivity (e.g. a specific bulk resistivity) of at least one of the host material, the self-segregating compound, or the alloying element may be less than a specific resistivity (e.g. a specific bulk resistivity) of the semiconductor material.

According to various embodiments, a specific resistivity (e.g. a specific bulk resistivity) of at least one of the host material or the alloying element may be less than about 10 $\mu$Ohm·m, e.g. less than about 5 $\mu$Ohm·m, e.g. less than about 2 $\mu$Ohm·m.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method, comprising:
    forming a metallization layer over a semiconductor region, wherein the metallization layer comprises a self-segregating composition comprising an alloying element and a host material; and
    forming a self-organizing barrier layer between the host material and the semiconductor region, wherein forming the self-organizing barrier layer comprises activating a segregation of the alloying element from the self-segregating composition
    forming a further barrier layer between the metallization layer and the semiconductor region, the further barrier layer comprising at least one defect including an opening extending through the further barrier,
    wherein forming the self-organizing barrier layer comprises sealing the at least one defect in the further barrier layer with the self-organizing barrier layer.

2. The method of claim 1,
    wherein activating the segregation of the alloying element from the metallization layer comprises heating the metallization layer.

3. The method of claim 2,
    wherein heating the metallization layer comprises heating the metallization layer to a temperature greater than a segregation temperature needed to activate the segregation of the alloying element from the metallization layer.

4. The method of claim 1,
    wherein activating the segregation of the alloying element from the metallization layer comprises activating a migration of the alloying element from the metallization layer towards the semiconductor region.

5. The method of claim 1,
    wherein activating the segregation of the alloying element from the metallization layer comprises reducing a concentration of the alloying element in the metallization layer.

6. The method of claim 5,
    wherein the concentration of the alloying element in the metallization layer before activating the segregation is greater than the concentration of the alloying element in the metallization layer after activating the segregation.

7. The method of claim 5, wherein the concentration of the alloying element in the metallization layer before or after activating the segregation is less than a concentration of the alloying element in the self-organizing barrier layer.

8. The method of claim 1,
    wherein a concentration of the alloying element in the metallization layer is less than a concentration of the host material in the metallization layer.

9. The method of claim 1,
    wherein a concentration of the alloying element in the metallization layer is substantially homogenous in the metallization layer.

10. The method of claim 1,
    wherein the metallization layer is in physical contact with the semiconductor region.

11. The method of claim 1,
    wherein the self-organizing barrier layer comprises a barrier compound including the alloying element and semiconductor material of the semiconductor region.

12. The method of claim 11,
    wherein a concentration of the barrier compound in the self-organizing layer barrier layer is greater than 70 at %.

13. The method of claim 11,
    wherein a concentration of the barrier compound in the self-organizing layer barrier layer is greater than 99 at %.

14. The method of claim 1,
wherein the alloying element includes at least one of manganese, tantalum, chromium, tungsten, and/or molybdenum.

15. The method of claim 1,
wherein a thickness of the metallization layer before activating the segregation is greater than a thickness of the metallization layer after activating the segregation.

16. The method of claim 1,
wherein a thickness of the metallization layer before or after activating the segregation is greater than one hundred times a thickness of the self-organizing barrier layer.

17. The method of claim 1,
wherein the self-organizing barrier layer physically separates the metallization layer from the semiconductor region.

18. The method of claim 1,
wherein the alloying element is configured to segregate from the metallization layer faster than the metallization layer chemically reacts with semiconductor material of the semiconductor region.

19. A method, comprising:
forming a metallization layer over a barrier layer;
wherein the metallization layer comprises an alloying element configured to be self-segregating from the metallization layer;
healing a defect in the barrier layer by segregating the alloying element from the metallization layer to at least one of in or over the defect.

* * * * *